(12) United States Patent
Shimamura

(10) Patent No.: US 6,294,226 B1
(45) Date of Patent: *Sep. 25, 2001

(54) METHOD AND APPARATUS FOR PRODUCING PLASTIC CONTAINER HAVING CARBON FILM COATING

(75) Inventor: Eihaku Shimamura, Tokyo-to (JP)

(73) Assignee: Kirin Beer Kabushiki Kaisha, Tokyo-to (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/355,969
(22) PCT Filed: Feb. 17, 1998
(86) PCT No.: PCT/JP98/00640
  § 371 Date: Aug. 19, 1999
  § 102(e) Date: Aug. 19, 1999
(87) PCT Pub. No.: WO98/37259
  PCT Pub. Date: Aug. 27, 1998

(30) Foreign Application Priority Data

Feb. 19, 1997 (JP) .................................................. 9-34508
Mar. 14, 1997 (JP) .................................................. 9-61338

(51) Int. Cl.[7] .................................................. C23C 16/26
(52) U.S. Cl. .................. 427/577; 427/238; 118/723 E
(58) Field of Search .................................. 427/577, 238; 118/723 E

(56) References Cited

FOREIGN PATENT DOCUMENTS 8-53117 * 2/1996 (JP).

* cited by examiner

*Primary Examiner*—Kishor Mayekar
(74) *Attorney, Agent, or Firm*—Oblon, Spivak, McClelland, Maier & Neustadt, P.C.

(57) ABSTRACT

There is provided an apparatus for manufacturing a plastic container coated with a diamond-like carbon film comprising; an outer electrode in which a chamber is formed, the shape of the chamber being comparable to an outline of the plastic container, the plastic container being received in the chamber, an inner surface of the chamber of the outer electrode being formed in the shape where the plastic container having a protrusion can be received within the chamber; an inner electrode inserted into the plastic container which is received within the chamber of the outer electrode; and an attaching member which has an inner surface, the shape of the inner surface being comparable to the outline of the plastic container, the attaching member covering an area where the protrusion is formed when the attaching member is attached to the plastic container, the attaching member being able to be received within the chamber of the outer electrode in company with the plastic container in state where the attaching member is attached to the plastic container, the attaching member being electrically conductive. The diamond-like carbon film is formed on an inner surface of the plastic container received in the chamber by generating plasma between the outer electrode and the inner electrode after the chamber is evacuated and gas as a carbon source is supplied into the chamber. The attaching member is set in a space formed between the inner surface of the chamber of the outer electrode and an outer surface of the plastic container received in the chamber.

32 Claims, 26 Drawing Sheets

METHOD AND APPARATUS FOR PRODUCING PLASTIC CONTAINER HAVING CARBON FILM COATING

This application is a 35 USC 371 National Stage application of PCT/JP98/00640 filed Feb. 17, 1998.

BACKGROUND OF THE INVENTION

1. Field of the Invention

The present invention relates to an apparatus and a method for manufacturing a plastic container which is provided with high barrier property and returnable property, especially relates to an apparatus and a method for forming a diamond-like carbon (DLC) film on an inner surface of a plastic container so that the film is uniform in its thickness, or an apparatus and a method for mass-producing plastic containers where the DLC film is formed on an inner wall of the container so as to be uniform in its condition in the whole of the container.

2. Description of the Related Art

Generally, a plastic container is used in various fields such as foods, medical supplies or the like, because of its various properties. Namely, for example, it is easy to form and is light in weight. And furthermore, the cost of producing the plastic container is low.

However, it is well known that plastic has undesirable properties of permitting low molecular gas such as oxygen or carbon dioxide to permeate through it, or permitting bringing sorption of low molecular organic compound (a property of absorbing molecular organic compound into a plastic composition). Therefore, the purposes of plastic container or the cases where the container can be used are widely limited in comparison with other container formed of glass or the like.

For instance, when the plastic container is used for holding a beverage which is apt to deteriorate by oxidization, there is some possibility that the beverage in the container deteriorates with age because oxygen can permeate plastic and reach the inside of the container. And when the plastic container is used for holding a carbonated drink such as beer, there is a fault that time in which can be spent on a distribution of the drink unfortunately comes to be shorter as compared with the other containers such as glass containers or the like because there is the possibility that the drink goes flat by releasing of carbon dioxide gas through the plastic wall of the container.

When the plastic container is used for holding a beverage, such as orange juice, including aroma compositions, the balance of the plural aroma compositions is broken and quality of the beverage is spoiled because low molecular organic compounds as the aroma compositions such as limonene included in the orange juice are absorbed in plastic. So, cases where the plastic container can be used as a container for beverages including such an aroma composition is unfortunately restricted.

And, the plastic container may deteriorate purity of material held in the container by elution of low molecular compound, such as plasticizer, residual monomer or other addition agent, included in the plastic compositions. Therefore, the plastic container is not used as a container for holding a substance specially in a case where purity of the substance held within the container should be maintained.

On the other hand, in recent years, making good use of resources is specially asserted and recycling of spent containers is a subject of study at present. However, if the plastic container is used as a returnable container, various low molecular compositions, for example, compositions causing a smell such as an odor of mold, are absorbed into plastic. Since these compositions absorbed into plastic are remained after washing of the plastic container, it is not sanitary to recycle it. There is also the possibility that the low molecular compositions as heterogeneity gradually soaks into contents held in the container to deteriorates the contents.

Therefore, in a case where the plastic container is used as a returnable container, it is necessary to inspect the plastic container which has been collected for the purpose of checking whether there is any residual heterogeneity. So, it is extremely rare to use the plastic container as a returnable container at present because the inspecting operation as to residual heterogeneity is a time-consuming job.

However, since the plastic container has the merits that it is easy to form, is light in weight, and is low-cost, it is very convenient to be able to use the plastic container for holding beverages such as carbonated drinks, beverages including flavor composition or material whose purity has to be maintained. And it is also greatly convenient to be able to use the plastic container as a returnable container.

The applicant of the present invention proposed an invention by which the plastic container can be used as a returnable container in the previous patent application (Japanese Patent Application No. 189224 of 1994), paying attention to convenience of the plastic container.

The invention of the previous application is related to an apparatus for forming DLC (Diamond Like Carbon) film on the inner surface of the plastic container so as to improve the property of gas barrier of the wall and prevent from absorbing of low molecular compound into the plastic container.

The DLC film mentioned above is hard carbon film also called "i carbon" or "amorphous hydrocarbon", and is amorphous carbon film mainly consisting of $SP^3$ bond. The DLC film, which is extremely hard, has good electrical insulating property and high refractive index.

In the previous application, an apparatus for manufacturing the above plastic container coated with the carbon film is proposed. By the apparatus, the DLC thin film is formed on the inner surface of the plastic container to produce the plastic container which can be used as a returnable container through preventing permeating of gas via plastic and absorbing low molecular organic compound by forming the DLC film.

As shown in FIG. 25, the above apparatus for manufacturing the plastic container coated with the carbon film is provided with ceramic insulating plate 2 attached on a base 1, an outer electrode 3 attached on the insulating plate 2, and an inner electrode 4 inserted into a chamber formed in the outer electrode 3.

The outer electrode 3 composes a vacuum chamber in its inner space. The vacuum chamber is prepared for plasma discharge. By a vacuum pump not shown, the vacuum chamber is exhausted via a exhaust tube 5 until the chamber comes to be evacuated, after a plastic container B is inserted into a body part 3A and the chamber is sealed by a lid part 3B.

After spouting out the raw gas which has been supplied via a providing tube 6 into the chamber of the electrode 3 from spouting holes 4A formed in the inner electrode 4 so that a raw gas is diffused uniformly in the evacuated chamber, electric power is given to the outer electrode 3 by a high frequency power source 8 through a matching circuit 7. In this way, plasma is generated between the outer electrode 3 and the inner electrode 4 connected to ground earth, and then the DLC film is formed on the inner surface of the plastic container B by plasma.

In this apparatus for manufacturing the plastic container coated with the DLC film, the chamber of the outer electrode 3 is formed in a shape almost similar to the outer surface of the plastic container B, and the outer surface of the inner electrode 4 is formed in a shape almost similar to the inner surface of the wall of the plastic container B, therefore, the gap between these electrodes is made uniform. And the DLC film is formed only on the inner surface of the wall of the plastic container B because the raw gas is spouted into the inside of the plastic container B.

Furthermore, in the apparatus, since the outer electrode composes the vacuum chamber, the time required for evacuating the vacuum chamber can be remarkably shorten, and therefore, the mass production of the plastic returnable container comes to be realizable.

As mentioned above, the DLC film is restrictively formed only on the inner surface of the wall of the container B for the purpose of avoiding deteriorating quality of the plastic container B. If the DLC film is also formed on the outer surface of the wall of the plastic container B, there is the possibility that the thin and hard DLC film formed on the outer surface is damaged because the containers collides with each other or are rubbed each other during a process of manufacturing in a factory or a channel of distribution in a case where the plastic container is used as a returnable container.

The plastic container is extremely lighter than usual returnable containers such as a glass container. Therefore, it is feared that the plastic container falls down when they are carried on a conveyor on purpose to fill or cork the same. And, in a beverage factory or the like, it is necessary to fill the container at a high speed in order to obtain high productivity, therefore, the light plastic container has to be supported while the container is being filled with contents in order to prevent the plastic container from falling down.

And furthermore, if the plastic container is not supported during corking the container after the filling process, the shape of the plastic container may be changed by the high pressure in the vertical direction of the container given through the corking process, or the corking may come to be incomplete because the degree of intensity of the plastic container is weaker than that of other containers such as a glass container.

Therefore, as shown in FIG. 26, the plastic container has sometimes a supporting ring Bb positioned below a screw Ba formed in an opening portion of the container. This supporting ring Bb is formed as a projection in the shape of a flange which projects from the peripheral surface of the opening portion of the plastic container. When the plastic container B is carried while the container is filled and corked, the supporting ring Bb slides on a guide rail with the under surface of the supporting ring Bb touching the guide rail. As a result, falling of the plastic container B is prevented during the process of filling or corking, and the load in the vertical direction given during the corking process is received by the guide rail.

However, if the DLC film is formed in such a plastic container B having the supporting ring Bb in the opening portion of the container by the apparatus which is mentioned in the previous application and shown in FIG. 25, a gap around the opening portion of the container is inevitably formed. That is to say, as shown in FIG. 27, when the plastic container B is inserted into the outer electrode 3, no gap is made around a trunk portion and a shoulder portion of the plastic container B. However, a gap between the peripheral surface of the opening portion and the inner surface of the outer electrode 3 is inevitably made around the opening portion of the plastic container B because of forming the supporting ring Bb in the opening portion.

Accordingly, adhesion strength of the DLC film stuck to the inner surface of the plastic container in the area around the opening portion having the supporting ring Bb is necessarily lower. And the DLC film of the plastic container gets spotted because the thickness of the DLC film in the above area gets smaller than that in the area around the trunk portion and the shoulder portion.

There is also the problem that the gap between the inner surface of the outer electrode 3 into which the opening portion B' of the plastic container is inserted and the outer surface of the plastic container comes to be large and the DLC film formed in the plastic container gets spotted because the outside diameter of the screw Ba which is formed in the opening portion B' comes to be larger than the outside diameter of the other areas in the opening portion.

And, in the above apparatus for manufacturing the plastic container coated with the carbon film mentioned in the previous application, the shape of the outline of the inner electrode 4 which is inserted into the plastic container B as the object of coating is restricted by the inside diameter of the opening of the plastic container B. Therefore, in the case where the opening portion is formed so as to be slenderer than other portions, the gap between the outer electrode 3 and the inner electrode 4 in the area from the shoulder portion of the plastic container to the opening portion thereof may come to be smaller than that in the area of the trunk portion of the plastic container.

In consequence, when plasma is generated between the outer electrode 3 and the inner electrode 4 by giving electric power to the outer electrode 3, plasma is concentrated into the area from the shoulder portion of the plastic container to the opening portion thereof where the gap between the outer electrode 3 and the inner electrode 4 is smaller. Therefore, the following phenomena are occurred. For example, spots or patches in the DLC film are made because the thickness of the DLC film formed in the container has necessarily large dispersion and distortion of the opening portion of the plastic container B is caused by heat given through the plasma process.

On the other hand, the plastic container with the DLC film has to be produced in large quantities for distribution on a massive scale when the plastic container is used as a returnable container in a market. Moreover, the conditions of the coated DLC film must be same among all containers that is mass-produced, and manufacturing cost must be low.

To meet the above demands, the inventor of the present invention carried out the following experiment for mass-producing the plastic container coated with the DLC film. As shown in FIG. 28, plural chambers (three chambers Cr, Cc and Cl illustrated in FIG. 28) are arranged. The common high frequency power source Rf is connected to the chambers via a matching box M and the electric power is given to the chambers by the common high frequency power source Rf to try to manufacture the plural plastic containers with the DLC film at the same time.

However, in order to mass-produce the plastic container coated with the DLC film with the number of the chambers being increased as shown in FIG. 28, the conditions have to be kept even among the all chambers Cr, Cc and Cl to make the conditions of the DLC film in the containers completely even as to all the chambers. But the electric power given to the chambers could not actually get even among all chambers in the above experiment. Therefore, irregularity was caused among the DLC films of the plastic containers.

As a result of the experiment, it is recognized that when increasing the number of the chambers to mass-produce the plastic container coated with the DLC film, to keep the coating conditions same among the all chambers is extremely difficult in a technical viewpoint and the most important problem for mass-producing the plastic container coated with the DLC film is to discover the method for keeping the coating conditions for the DLC films even among the all chambers.

And furthermore, in order to lower the manufacturing cost of the plastic container with the DLC film, to shorten a duration for a coating process comes to be a problem.

SUMMARY OF THE INVENTION

The present invention is for solving the above problems about forming the DLC film in the plastic container.

The first object of the present invention is to provide an apparatus and a method for manufacturing the plastic container coated with the DLC film, by which the plastic container can be used as a returnable container. By the apparatus or method, the DLC film can be formed without spots on the surface of the plastic container having protrusion projecting from the outer surface of the container when plasma discharge is generated between the outer electrode and the inner electrode after the plastic container is inserted into a chamber shaped in an outer electrode and an inner electrode is inserted into the container.

The second object of the present invention is to provide an apparatus and a method for manufacturing the plastic container coated with the DLC film, by which the DLC film can be formed without spots and the container does not deformed through heat of plasma, preventing a concentration of the plasma discharge into a part of the plastic container.

The third object of the present invention is to provide an apparatus and a method for manufacturing the plastic container coated with the DLC film, by which the plastic container with the DLC film can be mass-produced so that the conditions of the coated DLC films are even about the manufactured containers as products.

The fourth object of the present invention is to provide an apparatus and a method for manufacturing the plastic container coated with the DLC film, by which the duration of the process for coating the DLC film can be short so that manufacturing efficiency is improved.

To achieve the above first object, according to the present invention in one preferred mode, there is provided an apparatus for manufacturing a plastic container coated with a DLC film comprising; an outer electrode in which a chamber is formed, the shape of the chamber being comparable to an outline of the plastic container, the plastic container being received in the chamber, an inner surface of the chamber of the outer electrode being formed in the shape where the plastic container having a protrusion can be received within the chamber; an inner electrode inserted into the plastic container which is received within the chamber of the outer electrode; and an attaching member which has an inner surface, the shape of the inner surface being comparable to the outline of the plastic container, the attaching member covering an area where the protrusion is formed when the attaching member is attached to the plastic container, the attaching member being able to be received within the chamber of the outer electrode in company with the plastic container in state where the attaching member is attached to the plastic container, the attaching member being electrically conductive; wherein the DLC film is formed on an inner surface of the plastic container received in the chamber by generating plasma between the outer electrode and the inner electrode after the chamber is evacuated and gas as a carbon source is supplied into the chamber; and wherein the attaching member is set in a space formed between the inner surface of the chamber of the outer electrode and an outer surface of the plastic container received in the chamber.

In the above apparatus for manufacturing a plastic container coated with a DLC film, the plastic container is received within the chamber formed in the outer electrode and plasma is generated between the inner electrode which is inserted into the plastic container and the outer electrode in order to form the DLC film on the inner surface of the plastic container. However, when the plastic container has the protrusion, such as a neck-supporting-ring which projects to the outside from an outer surface of an opening portion of the plastic container for preventing the container from falling down, a protrusion for designing, or a thread to which a cap is attached, it is every possibility that the inner surface of the chamber can not be formed in a shape comparable to the outer surface of the plastic container in the area of the protrusion. Accordingly, in an area adjacent to the protrusion, a gap is formed between the inner surface of the chamber of the outer electrode and the outer surface of the container. In the above apparatus, the conductive attaching member formed in the shape comparable to the outline of the container having the protrusion is attached to the outer surface of the plastic container so that the outer surface of the plastic container is covered by the attaching member in the area of the protrusion. And then, the attaching member is received in the chamber in company with the plastic container in state where the attaching member is set in the space formed between the inner surface of the outer electrode and the outer surface of the container in the area adjacent to the protrusion.

In the above apparatus for manufacturing a plastic container coated with a DLC film, no gap between the inner surface of the outer electrode and the outer surface of the plastic container in the whole of the outer surface of the plastic container is formed, even when the DLC film has to be formed in the plastic container which has the above protrusion. Therefore, condition where the DLC film is formed by plasma discharge in the area around the protrusion can be made comparable to that in the area apart from the protrusion, and the DLC film with no spots can be formed in the container having the protrusion.

In an embodiment of the above apparatus, to achieve the above first object, the attaching member is attached to the container in which the protrusion projects in the radial direction from the outer surface of the plastic container with the attaching member covering an outer surface of the plastic container in an area where the protrusion is formed; and the attaching member is supported in state where an outer surface of the attaching member substantially touches the inner surface of the chamber when the attaching member is received in the chamber of the outer electrode with the attaching member attached to the plastic container.

In this case, when the plastic container has the protrusion, such as a neck-supporting-ring which projects to the outside from an outer surface of an opening portion of the plastic container for preventing the container from falling down, a protrusion for designing, or a thread to which a cap is attached, the attaching member is attached to the container so that a depression of the uneven surface of the plastic container is filled up.

Accordingly, the chamber can be formed so that an inner diameter of the chamber in an area faces the attaching member is comparable to an outside diameter of the attaching member and an inner diameter of the chamber in the other area is comparable to an outside diameter of the container in the other area. Therefore, no gap is formed in the whole of the container along the inner surface of the chamber, and the DLC film can be formed on the inner surface of the container with no spots.

In an embodiment of the above apparatus, to achieve the above first object, the attaching member is composed of an upper part and a lower part; a flange as the protrusion projects in the radial direction from the outer surface of the plastic container in an area of an opening portion of the plastic container; the upper part of the attaching member is attached to the outer surface of the plastic container in an area above the flange, and the lower part of the attaching member is attached to the outer surface of the plastic container in an area under the flange; an outside diameter of the upper part of the attaching member is comparable to an outside diameter of the flange, and an outside diameter of the lower part of the attaching member is comparable to the outside diameter of the flange; and an outer surface of the upper part and an outer surface of the lower part are substantially flush with an peripheral surface of the flange in an area near to the flange.

In this case, it is not necessary to make an outer diameter of the attaching member larger than that of the protrusion. Accordingly, the attaching member can be light in weight.

In an embodiment of the above apparatus, to achieve the above first object, an inner surface of the attaching member is formed in a shape similar to the outer surface of the container which has the protrusion projecting in the radial direction from the outer surface of the plastic container; and the attaching member is received within the chamber of the outer electrode in company with the plastic container in state where the plastic container is received within the attaching member.

In this case, the whole of the container having the protrusion in the outer surface thereof is covered with the attaching member. Therefore, slighter gap along the inner surface of the chamber is formed when the container is received within the chamber. Accordingly, generating of spots in the DLC film formed in the inner surface of the container is more efficiently prevented.

According to the present invention in another preferred mode, to achieve the above second object, there is provided an apparatus for manufacturing a plastic container coated with a DLC film comprising; an outer electrode in which a chamber is formed, the shape of the chamber being comparable to an outline of the plastic container, the plastic container being received in the chamber; and an inner electrode inserted into the plastic container which is received within the chamber of the outer electrode; an outer electrode is divided into plural parts; the chamber is composed of the parts of the outer electrode assembled mutually with the parts of the outer electrode insulated by a insulating member; and a high frequency power source is connected to each of the parts of the outer electrode so that electric power can be given to each of parts of the outer electrode separately.

In the above apparatus for manufacturing a plastic container coated with a DLC film, plasma generated between the outer electrode and the inner electrode is not concentrated into an area where distance between the outer electrode and the inner electrode is small because the parts of the electrode are insulated mutually. And furthermore, strength of electric power given to each part of the outer electrode or time for giving electric power to each part of the outer electrode can be set in accordance with distance between each part of the outer electrode and the inner electrode.

Even when a shape of the outer surface of the inner electrode can not be formed so that distance between the inner surface of the outer electrode and the inner electrode is even in the whole of the container by restriction of a shape of the container, the DLC film can be formed in the inner surface of the container with no spots and deformation of the container caused by heat through concentration of plasma can be prevented.

And furthermore, strength of electric power given to the outer electrode in an area where distance between the outer electrode and the inner electrode is small can be made larger than that in an area where distance between these electrodes is large, or time for giving electric power to the outer electrode in an area where distance between the outer electrode and the inner electrode is small can be made longer than that in an area where distance between these electrodes is large. Accordingly, the DLC film can be formed evenly in the whole of the container.

In an embodiment of the above apparatus, to achieve the above second object, the outer electrode is divided into two parts as the parts of the outer electrode; and the trunk portion of a bottle as the plastic container is received within one of the two parts, and the shoulder portion and the opening portion of the bottle are received within the other part of the outer electrode.

In this case, deformation of the plastic container in an area from the opening portion to the shoulder portion of the container and generation of spots in the DLC film is prevented when the DLC film is formed to the plastic container, such as a bottle for a drink, in which a diameter in the area from the opening portion to the shoulder portion is smaller than that in an area of the trunk, because concentration of plasma into an area where distance between the outer electrode and the inner electrode can be prevented.

In an embodiment of the above apparatus, to achieve the first and second objects, an attaching member which has an inner surface, the shape of the inner surface being comparable to an outline of the plastic container, the plastic container having protrusion which projects in the radial direction from the outer surface of the plastic container, the attaching member covering an area where the protrusion is formed when the attaching member is attached to the plastic container, the attaching member being able to be received within the chamber of the outer electrode in company with the plastic container in state where the attaching member is attached to the plastic container, the attaching member being electrically conductive; an inner surface of the chamber composed of the parts of the outer electrode is formed in the shape where the plastic container having a protrusion can be received within the chamber; and the attaching member is set in a space formed between the inner surface of the chamber of the outer electrode and the outer surface of the container received within the chamber, and the space is formed because of receiving the protrusion in the chamber.

In this case, since electric power is given separately to each part of the outer electrode from the high frequency power source, and furthermore, the parts of the outer electrode forming the chamber are insulated mutually, concentration of plasma into an area where distance between the outer electrode and the inner electrode is prevented. When the DLC film is formed on the inner surface of the plastic container having the protrusion which projects from the outer surface of the container into the outside, such as a neck-supporting-ring which projects to the outside from an outer surface of an opening portion of the plastic container for preventing the container from falling down, a protrusion for designing, or a thread to which a cap is attached, a gap formed between the inner surface of the outer electrode and the outer surface of the plastic container received within the chamber is filled up with the attaching member received within the chamber in state where the attaching member is attached to the plastic container. Therefore, condition in which the DLC film is formed on the inner surface of the container in an area of the protrusion can be comparable to that in the other area. Accordingly, even if the plastic container has the protrusion, generation of spots in the DLC film is more completely prevented and deformation of the plastic container through heat caused by plasma is also prevented.

To achieve the above second object, an embodiment of the above apparatus comprises; high frequency power sources, the number of the power sources being the same with the number of the parts of the outer electrode, each of the power sources being connected to the corresponding one of the parts of the outer electrode.

In this case, when electric power is given to each part of the outer electrode, strength of electric power can be changed in accordance with distance between the outer electrode and the inner electrode in each part. Therefore, the even DLC film can be easily formed in the whole of the plastic container.

To achieve the above second object, an embodiment of the above apparatus comprises; a high frequency power sources, the power sources being connected to each of the parts of the outer electrode via a selector switch.

In this case, electric power is given to each part of the outer electrode in turn by switching of the selector switch. Therefore, electric power can be given to each of the plural parts of the outer electrode from only one high frequency power source. And furthermore, the even DLC film can be formed in the plastic container by setting timing for switching the selector switch according to distance between each part of the electrode and the inner electrode, for example.

To achieve the above first and second objects, an embodiment of the above apparatus comprises; a view port for monitoring the inside of the outer electrode via heat resisting glass attached to the outer electrode.

In this case, condition of generation of plasma in the chamber can be monitored via the view port. Therefore, condition of the generation of plasma can be kept most excellence and generating spots in the DLC film is prevent.

According to the present invention in another preferred mode, to achieve the above first object, there is provided a method for manufacturing a plastic container coated with a DLC film, comprising the steps of; inserting the plastic container into a chamber formed in a shape comparable to an outline of the container, the chamber being formed in an outer electrode; inserting an inner electrode into the container received in the chamber; evacuating the chamber and supplying gas as a carbon source into the chamber; and generating plasma between the outer electrode and the inner electrode so that the DLC film is formed on an inner surface of the plastic container; wherein an attaching member is attached to an outer surface of the plastic container having a protrusion which projects in the radial direction from the outer surface of the plastic container, and an inner surface of the attaching member is formed in the shape comparable to the outer surface of the plastic container; wherein the outer electrode is formed so that the plastic container having the protrusion can be received within the outer electrode, and the outer surface of the plastic container in an area of the protrusion is covered with the outer electrode; wherein the attaching member is set in a space formed between the inner surface of the chamber of the outer electrode and the outer surface of the plastic container when the plastic container to which the attaching member is attached is received within the chamber of the outer electrode in company with the attaching member, and the attaching member is electrically conductive; and wherein the space is formed because of receiving the plastic container having the protrusion within the chamber.

In the above method for manufacturing a plastic container coated with a DLC film, the plastic container is received within the chamber formed in the outer electrode and plasma is generated between the inner electrode which is inserted into the plastic container and the outer electrode in order to form the DLC film on the inner surface of the plastic container. However, when the plastic container has the protrusion, such as a neck-supporting-ring which projects to the outside from an outer surface of an opening portion of the plastic container for preventing the container from falling down, a protrusion for designing, or a thread to which a cap is attached, it is every possibility that the inner surface of the chamber can not be formed in a shape comparable to the outer surface of the plastic container in the area of the protrusion. Accordingly, in an area adjacent to the protrusion, a gap is formed between the inner surface of the chamber of the outer electrode and the outer surface of the container. In the above apparatus, the conductive attaching member formed in the shape comparable to the outline of the container having the protrusion is attached to the outer surface of the plastic container so that the outer surface of the plastic container is covered by the attaching member in the area of the protrusion. And then, the attaching member is received in the chamber in company with the plastic container in state where the attaching member is set in the space formed between the inner surface of the outer electrode and the outer surface of the container in the area adjacent to the protrusion.

In the above method for manufacturing a plastic container coated with a DLC film, no gap between the inner surface of the outer electrode and the outer surface of the plastic container in the whole of the outer surface of the plastic container is formed, even when the DLC film has to be formed in the plastic container which has the above protrusion. Therefore, condition where the DLC film is formed by plasma discharge in the area about the protrusion can be comparable to that in the area apart from the protrusion, and the DLC film with no spots can be formed in the container having the protrusion.

To achieve the above first object, in an embodiment of the above method, the attaching member is attached to the outer surface of the plastic container in the area of the protrusion in state where the area of the protrusion is covered; the attaching member attached to the plastic container is received within the chamber of the outer electrode in company with the plastic container; the attaching member is set in a space formed between the inner surface of the chamber and the outer surface of the plastic container; and the space is formed because of receiving the plastic container having the protrusion within the chamber.

In this case, when the plastic container has the protrusion, such as a neck-supporting-ring which projects to the outside from an outer surface of an opening portion of the plastic container for preventing the container from falling down, a protrusion for designing, or a thread to which a cap is attached, the attaching member is attached to the container so that a depression of the uneven surface of the plastic container is filled up.

Accordingly, the chamber can be formed so that an inner diameter of the chamber in an area faces the attaching member is comparable to an outside diameter of the attaching member and an inner diameter of the chamber in the other area is comparable to an outside diameter of the container in the other area. Therefore, no gap is formed in the whole of the container along the inner surface of the chamber, and the DLC film can be formed on the inner surface of the container with no spots.

To achieve the above first object, in an embodiment of the above method; the outer surface of the plastic container is covered with the attaching member within which the plastic container is received; the attaching member within which the plastic container is received is received within the chamber of the outer electrode; and the chamber is formed in the shape comparable to an outer surface of the attaching member.

In this case, the whole of the container having the protrusion in the outer surface thereof is covered with the attaching member. Therefore, slighter gap along the inner surface of the chamber is only formed when the container is received within the chamber. Accordingly, generating of spots in the DLC film formed in the inner surface of the container is more efficiently prevented.

According to the present invention in another preferred mode, to achieve the above second object, there is provided a method for manufacturing a plastic container coated with a DLC film, comprising the steps of; inserting the plastic container into a chamber formed in a shape comparable to an outline of the container, the chamber being formed in an outer electrode; inserting an inner electrode into the container received in the chamber; evacuating the chamber and supplying gas as a carbon source into the chamber; and generating plasma between the outer electrode and the inner electrode so that the DLC film is formed on an inner surface of the plastic container; wherein the outer electrode is divided into plural parts, and the parts are assembled into the outer electrode in which the chamber is formed in state where the parts is insulated by an insulating member mutually; and wherein a high frequency power source system is connected to each of the parts of the outer electrode so that electric power is given to each of the parts of the outer electrode separately.

In the above method for manufacturing a plastic container coated with a DLC film, plasma generated between the outer electrode and the inner electrode is not concentrated into an area where distance between the outer electrode and the inner electrode is small because the parts of the electrode are insulated mutually. And furthermore, strength of electric power given to each part of the outer electrode or time for giving electric power to each part of the outer electrode can be set in accordance with distance between each part of the outer electrode and the inner electrode.

When a shape of the outer surface of the inner electrode can not be formed so that distance between the inner surface of the outer electrode and the inner electrode is even in the whole of the container by restriction of a shape of the container, the DLC film can be formed in the inner surface of the container with no spots and deformation of the container caused through heat caused by concentration of plasma can be prevented.

And furthermore, strength of electric power given to the outer electrode in an area where distance between the outer electrode and the inner electrode is small can be made larger than that in an area where distance between these electrodes is large, or time for giving electric power to the outer electrode in an area where distance between the outer electrode and the inner electrode is small can be made longer than that in an area where distance between these electrodes is large. Accordingly, the DLC film can be formed evenly in the whole of the container To achieve the above second object, in an embodiment of the above method; the high frequency power source system have plural high frequency power sources the number of which is the same with the number of the parts of the outer electrode, and each of the high frequency power sources is connected to the corresponding part of the outer electrode.

In this case, when electric power is given to each part of the outer electrode, strength of electric power can be changed in accordance with distance between the outer electrode and the inner electrode in each part. Therefore, the even DLC film can be easily formed in the whole of the plastic container.

To achieve the above second object, in an embodiment of the above method; the high frequency power source system consists of a high frequency power source and the high frequency power source is connected to each part of the outer electrode via a selector switch.

In this case, electric power is given to each part of the outer electrode in turn by switching of the selector switch. Therefore, electric power can be given to each of the plural parts of the outer electrode from only one high frequency power source. And furthermore, the DLC film can be formed even in the plastic container by setting timing for switching the selector switch in accordance with distance between each part of the electrode and the inner electrode, for example.

According to the present invention in one preferred mode, to achieve the above third object, there is provided an apparatus for manufacturing a plastic container coated with a DLC film comprising; plural outer electrodes in each of which a chamber is formed, the plastic container being received in the chamber; and inner electrodes each of which is inserted into the plastic container received within the chamber of each of the outer electrodes; wherein the DLC film is formed on an inner surface of the plastic container by generating plasma between the outer electrode and the inner electrode when electric power is given to the outer electrodes by a high frequency power source after the chamber is evacuated and gas as a carbon source is supplied into the chamber; and wherein the high frequency power source is connected to each of the outer electrodes, and the outer electrodes are connected by a wire mutually.

In the above apparatus for manufacturing a plastic container coated with a DLC film, the plural outer electrodes are short-circuited mutually by a wire. Therefore, electrode power given to the outer electrodes are substantially even and condition of vacuum in the chamber and a feed rate of gas as a carbon source into the chambers of the electrodes are even. Accordingly, a plastic container coated with a DLC film can be mass-produced, where condition of the DLC film coated in the manufactured plastic container is substantially even.

If the plural outer electrodes are merely connected to the high frequency power source, thickness of the DLC film formed in the plastic container is made uneven because electric power given to the outer electrodes by the high frequency power source is divided uneven on account of difference of value of resistance in terminal areas where the wire is connected the outer electrode with the high frequency power source or difference of value of curve resistance of the wire. On the other hand, in the above apparatus, since the plural outer electrodes are connected mutually by the wire, electric power is divided even into these outer electrodes and the plural plastic containers coated with the DLC film in which condition of coating is substantially even can be manufactured at the same time.

To achieve the above third object, in an embodiment of the above apparatus; each of the outer electrodes is divided into plural parts, and the parts of the outer electrode are assembled into the chamber with the parts being insulated mutually by an insulating member; the high frequency power source is connected to each parts of the outer electrodes; and the corresponding parts of the respective electrodes are connected to each other by a wire.

In this case, even if distance between the outer electrodes and the inner electrodes is uneven according to the shape of the container or the like, the DLC film is formed even in the whole of the container because electric power given to each part of the outer electrode can be controlled separately. And furthermore, since the corresponding parts of the respective electrodes are connected to each other by the wire, electric power is distributed even among the parts corresponding to each other. Accordingly, the DLC film can be formed even in the whole of the container and the plural plastic containers coated with the DLC film in which condition of coating is substantially even can be manufactured at the same time.

To achieve the above third object, in an embodiment of the above apparatus, the plural outer electrodes are arranged in a circular arc; and the high frequency power source is connected to each of the outer electrodes by wires extended in a straight line from the center of the circular arc of the electrodes, and each of the outer electrodes is connected to the adjacent outer electrode by a wire.

In this case, since the wires which extends from the high frequency power source to outer electrodes can be equivalent in length and curve resistance can be ignored because the wire is extended in a straight line, electric power can be distributed more even to the outer electrodes from the high frequency power source, and the plural plastic containers coated with the DLC film in which condition of coating is further even can be manufactured at the same time.

To achieve the above third object, in an embodiment of the above apparatus; the plural outer electrodes are arranged in a circle; and the high frequency power source is connected to each of the outer electrodes by wires extended in a straight line from the center of the circle of the electrodes, and each of the outer electrodes is connected to the adjacent outer electrode by a wire.

In this case, all the wires which extends from the high frequency power source to outer electrodes can be equivalent in length, and curve resistance can be ignored because the wire is extended in a straight line. And furthermore, each of the outer electrodes is connected to the adjacent outer electrode by the wire. Therefore, condition in which the outer electrodes are connected to the high frequency power source can be the same mutually. Accordingly, condition of coating the DLC film in the outer electrodes can be the same with each other, and the plural plastic containers coated with the DLC film in which condition of coating is further even can be manufactured at the same time.

According to the present invention in another preferred mode, to achieve the above fourth object, there is provided an apparatus for manufacturing a plastic container coated with a DLC film comprising; an outer electrode in which a chamber is formed, the plastic container being received in the chamber; and an inner electrode inserted into the plastic container received within the chamber of the outer electrode; wherein the DLC film is formed on an inner surface of the plastic container by generating plasma between the outer electrode and the inner electrode when electric power is given to the outer electrode by a high frequency power source after the chamber is evacuated and gas as a carbon source is supplied into the chamber; wherein the apparatus is provided with a reserve tank connected to the chamber via a valve and plural vacuum pump systems connected to the chamber via plural valves, respectively; and wherein the chamber is evacuated by using the reserve tank and the plural vacuum pumps systems step by step when the valves are opened in turn.

In the above apparatus for manufacturing a plastic container coated with a DLC film, when the plastic container is received within the chamber, the valve of the reserve tank in which degree of vacuum is kept in a predetermined value is opened so that the chamber is evacuated in quick motion. After that, the plural vacuum pumps having different performance are operated within the limits of pressure suitable for there pumps, respectively. Accordingly, degree of vacuum necessary for plasma discharge can be gotten.

In the above apparatus for manufacturing a plastic container coated with a DLC film, the valve of the reserve tank in which degree of vacuum is kept in a predetermined value is opened so that the chamber is evacuated in quick motion. After that, the plural vacuum pumps having different performance are operated within the limits of pressure suitable for their pumps, respectively, and can give full play to it's ability. Accordingly, degree of vacuum necessary for plasma discharge can be gotten in a short time and the manufacturing efficiency of the plastic container coated with the DLC film can be improved.

In this case, one of the pump systems may include a mechanical booster pump and a rotary pump.

One of the pump systems may include a cryopump.

According to the present invention in another preferred mode, to achieve the above fourth object, there is provided an apparatus for manufacturing a plastic container coated with a DLC film comprising; plural outer electrodes in each of which a chamber is formed, the plastic container being received in the chamber; inner electrodes each of which is inserted into the plastic container received within the chamber of each of the outer electrodes; plural individual reserve tanks connected to the chambers via a valve; a common reserve tank connected to the chambers via a valve; and plural vacuum pump systems; wherein the DLC film is formed on an inner surface of the plastic container by generating plasma between the outer electrode and the inner electrode when electric power is given to the outer electrodes by a high frequency power source after the chamber is evacuated and gas as a carbon source is supplied into the chamber; wherein the outer electrodes are divided into plural groups; wherein the common reserve tank is used for all the groups of the outer electrodes; wherein each of the individual reserve tanks and each of the vacuum pumps is used only for each of the groups of the outer electrodes, respectively; and the chamber is evacuated by the common reserve tank, the reserve tanks and the vacuum pumps systems step by step when the valves are opened in turn.

In this case, even if the number of the chambers is increased so that the number of the plastic container produced in a one process is increased for mass-production, time necessary for evacuating the chambers is prevented from being longer because the common reserve tank is used for all the groups of the outer electrodes and each of the individual reserve tanks and each of the vacuum pumps are used only for each of the groups of the outer electrodes, respectively. If a large tank as the common reserve tank is used, time for evacuation can be shortened further.

In this case, more than a common reserve tank may be provided.

According to the present invention in another preferred mode, to achieve the above third object, there is provided a method for manufacturing a plastic container coated with a DLC film, comprising the steps of; inserting the plastic container into a chamber formed in each of plural outer electrodes; inserting an inner electrode into the container received in the chamber of each outer electrodes; evacuating the chamber and supplying gas as a carbon source into the chamber; and generating plasma between the outer electrode and the inner electrode when electric power is given to the outer electrodes by high frequency power source so that the DLC film is formed on an inner surface of the plastic container; wherein the high frequency power source is connected to each of the outer electrodes and the outer electrodes are connected mutually by a wire.

In the above method for manufacturing a plastic container coated with a DLC film, the plural outer electrodes are short-circuited mutually by a wire. Therefore, electric power given to the outer electrodes are substantially even and condition of vacuum in the chamber and a feed rate of gas as a carbon source into the chambers of the electrodes are even. Accordingly, a plastic container coated with a DLC film can be mass-produced, where condition of the DLC film coated in the manufactured plastic container is substantially even If the plural outer electrodes are merely connected to the high frequency power source, thickness of the DLC film formed in the plastic container is made uneven because electric power given to the outer electrodes by the high frequency power source is divided uneven on account of difference of value of resistance in terminal areas where the wire is connected to the outer electrode and the high frequency power source or difference of value of curve resistance of the wire. On the other hand, in the above apparatus, since the plural outer electrodes are connected mutually by the wire, electric power is divided even into these outer electrodes and the plural plastic containers coated with the DLC film in which condition of coating is substantially even can be manufactured at the same time.

To achieve the above fourth object, in an embodiment of the above method; the plural outer electrodes are arranged in a circle; and the high frequency power source is connected to each of the outer electrodes by wires extended in a straight line from the center of the circle of the electrodes, and each of the outer electrodes is connected to the adjacent outer electrode by a wire.

In this case, all the wires which extends from the high frequency power source to outer electrodes can be equivalent in length, and curve resistance can be ignored because the wire is extended in a straight line. And furthermore, each of the outer electrodes is connected to the adjacent outer electrode by the wire. Therefore, condition in which the outer electrodes are connected to the high frequency power source can be the same with each other. Accordingly, condition of coating the DLC film in the outer electrodes can be the same with each other, and the plural plastic containers coated with the DLC film in which condition of coating is further even can be manufactured at the same time.

According to the present invention in another preferred mode, to achieve the above third object, there is provided a method for manufacturing a plastic container coated with a DLC film, comprising the steps of; inserting the plastic container into a chamber formed in an outer electrode; inserting an inner electrode into the container received in the chamber; evacuating the chamber and supplying gas as a carbon source into the chamber; and generating plasma between the outer electrode and the inner electrode when electric power is given to the outer electrode by high frequency power source so that the DLC film is formed on an inner surface of the plastic container; wherein a reserve tank is connected to the chamber via a valve; wherein plural vacuum pump systems are connected to the chamber via valves, respectively; and wherein the chamber is evacuated by the reserve tank and the plural vacuum pump systems step by step when the valves are opened in turn.

In the above method for manufacturing a plastic container coated with a DLC film, when the plastic container is received within the chamber, the valve of the reserve tank in which degree of vacuum is kept in a predetermined value is opened so that the chamber is evacuated in quick motion. After that, the plural vacuum pumps having different performance are operated within the limits of pressure suitable for their pumps, respectively. Accordingly, degree of vacuum necessary for plasma discharge can be gotten.

In the above method for manufacturing a plastic container coated with a DLC film, the valve of the reserve tank in which degree of vacuum is kept in a predetermined value is opened so that the chamber is evacuated in quick motion. After that, the plural vacuum pumps having different performance are operated within the limits of pressure suitable for their pumps, respectively, and can give full play to it's ability. Accordingly, degree of vacuum necessary for plasma discharge can be gotten in a short time and the manufacturing efficiency of the plastic container coated with the DLC film can be improved In this case, one of the pump systems may include a mechanical booster pump and a rotary pump.

One of the pump systems may include a cryopump.

To achieve the above fourth object, in an embodiment of the above method; the reserve tank is connected to the chamber via the first valve; one of the pump systems including a rotary pump is connected to the chamber via the second valve; another one of the pump systems including a cryopump is connected to the chamber via the third valve; and the chamber is evacuated by using the reserve tank when opening the first valve before the chamber is evacuated by using the pump systems including the rotary pump when opening the second valve, and after that the chamber is evacuated by using the pump systems including the cryopump when opening the third valve until pressure in the chamber is reduced to a predetermined value.

According to the present invention in another preferred mode, to achieve the above fourth object, there is provided a method for manufacturing a plastic container coated with a DLC film, comprising the steps of; inserting the plastic container into a chamber formed in each of plural outer electrodes; inserting an inner electrode into the container received in the chamber of each outer electrodes; evacuating the chamber and supplying gas as a carbon source into the chamber; and generating plasma between the outer electrode and the inner electrode when electric power is given to the outer electrodes by high frequency power source so that the DLC film is formed on an inner surface of the plastic container; wherein plural individual reserve tanks are connected to the chamber via a valve; wherein a common reserve tank is connected to the chamber via a valve; wherein the DLC film is formed on an inner surface of the plastic container by generating plasma between the outer electrode and the inner electrode when electric power is given to the outer electrodes by a high frequency power source after the chamber is evacuated and gas as a carbon source is supplied into the chamber; wherein the outer electrodes are divided into plural groups; wherein each of the individual reserve tanks and each of plural vacuum pumps are used for each of the groups of the outer electrodes, respectively; wherein the common reserve tank is used for all the groups of the electrodes; and wherein the chamber is evacuated by the common reserve tank, the reserve tanks and the vacuum pumps systems step by step when the valves are opened in turn.

In this case, even if the number of the chambers is increased so that the number of the plastic container produced in a one process is increased for mass-production, time necessary for evacuating the chambers is prevented from being longer because the common reserve tank is used for all the groups of the outer electrodes and each of the individual reserve tanks and each of the vacuum pumps are used only for each of the groups of the outer electrodes, respectively. If a large tank as the common reserve tank is used, time for evacuation can be shortened further.

In this case, more than a common reserve tank may be provided.

DETAILED DESCRIPTION OF THE PREFERRED EMBODIMENTS

The preferred embodiment of the present invention will now be explained below with reference to the attached drawings.

Figure 1:
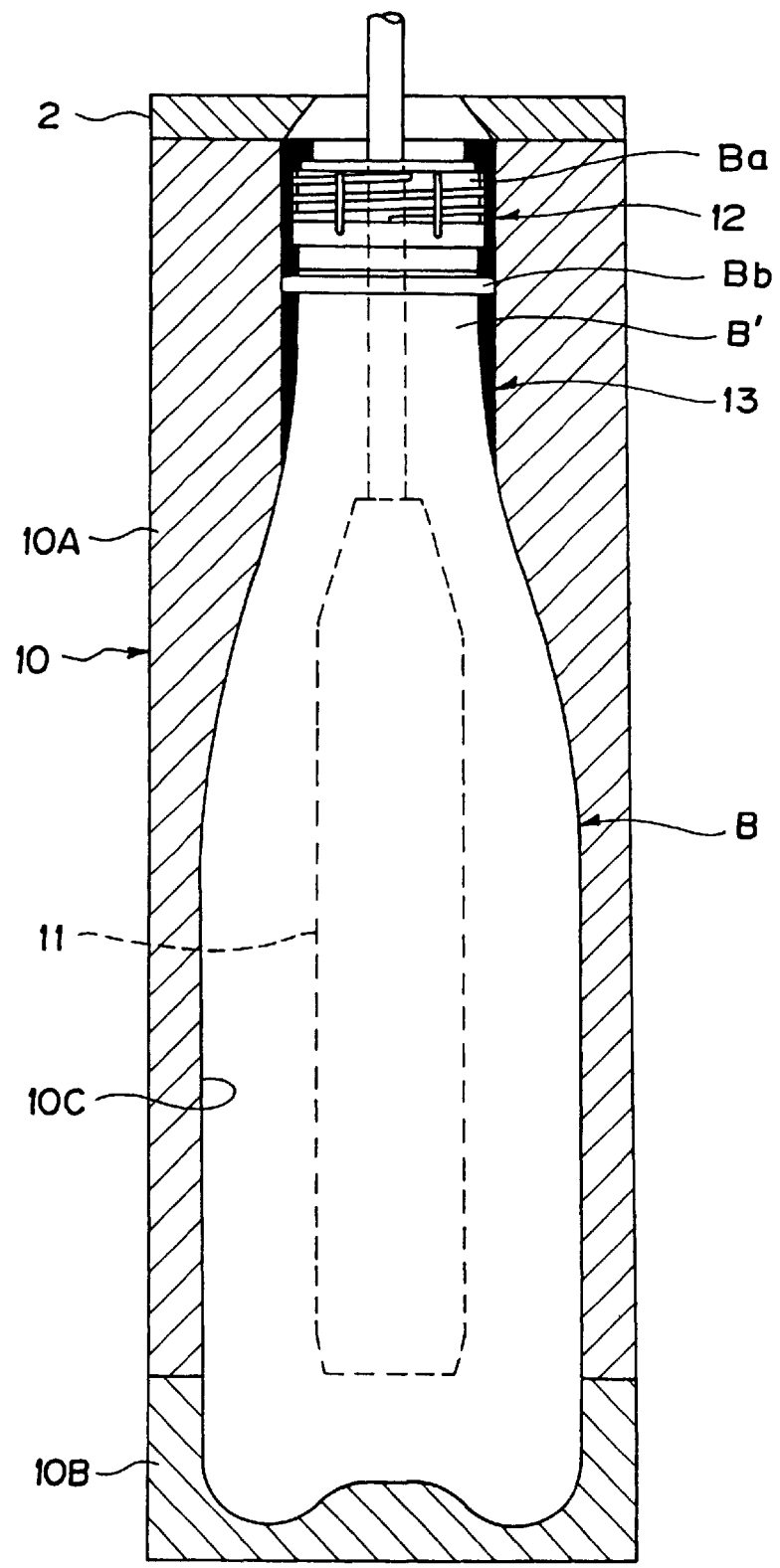
FIG. 1 is a longitudinal sectional view showing an embodiment of an apparatus for manufacturing a plastic container coated with a DLC film, to which the invention is applied.

In FIG. 1, the above embodiment of an apparatus for manufacturing a plastic container coated with diamond-like carbon (DLC) film.

The view of FIG. 1 is illustrated upside down against FIG. 25 because the view of FIG. 1 shows a type of the apparatus in which the plastic container is inserted upward into an outer electrode from under the outer electrode as will be mentioned later.

The apparatus is provided with an outer electrode 10 composed of a body 10A and a lid 10B, in which a chamber 10C is formed in the similar shape of an outline of a plastic container B, an inner electrode 11 formed in a shape almost similar to the inner space of the plastic container B, which can be inserted into the plastic container B received in the chamber 10C of the outer electrode 10. The plastic container B standing upright on the lid 10B is inserted into the body 10A as the lid 10B goes up. An inner space of the body 10A is sealed up by the lid 10B when the plastic container B is received in the chamber 10C of the outer electrode 10.

The reference numeral "2" of FIG. 1 represents insulating plate.

In the above apparatus, material gas is supplied to the inner space of the plastic container B received in the outer electrode 10 after the chamber 10C is evacuated by operating a vacuum equipment (not shown in the figure). And then, high frequency voltage is given between the outer electrode 10 and the inner electrode 11 to generate plasma so that the DLC film is formed on the inner surface of the plastic container B.

Figure 25:
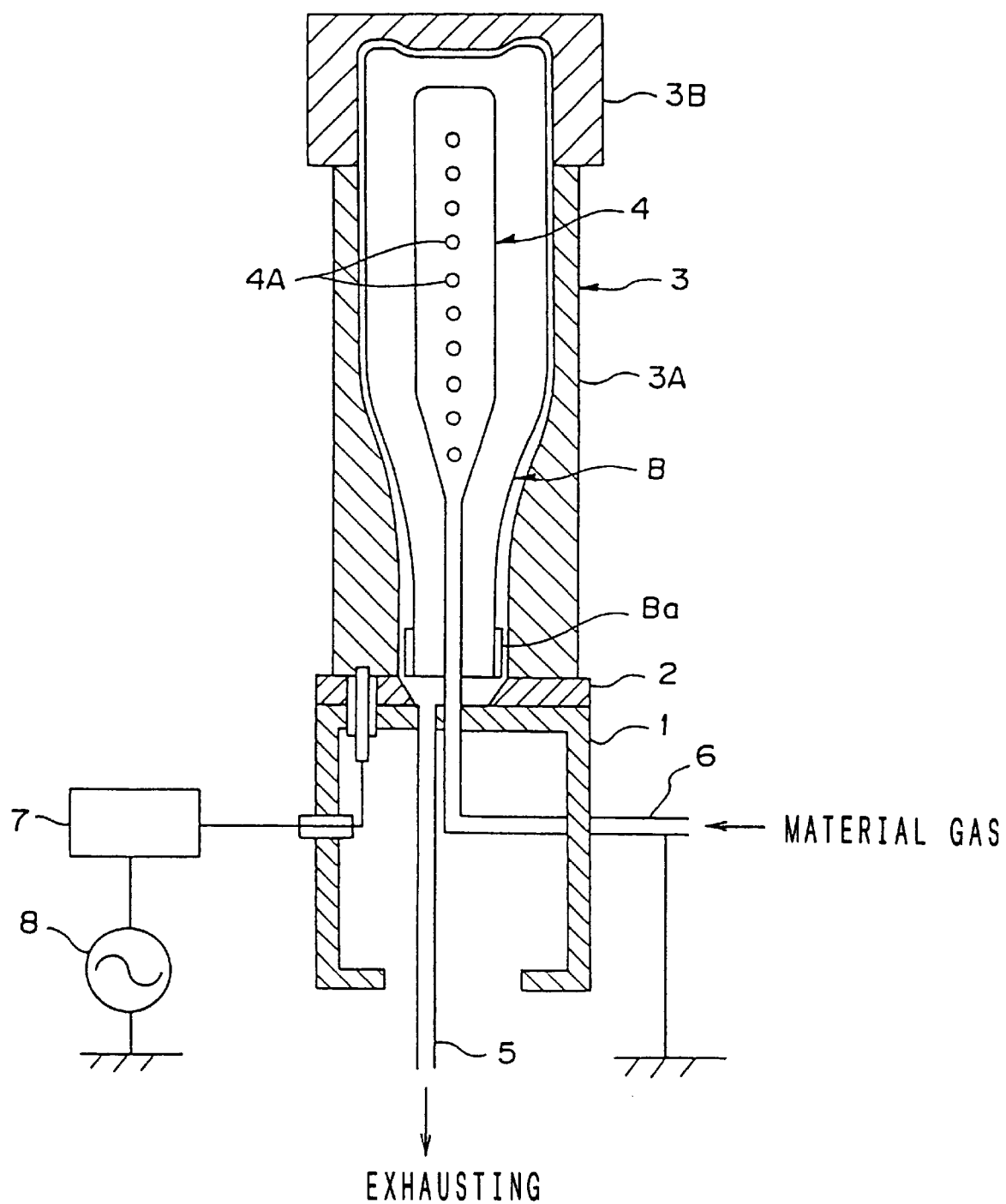
FIG. 25 is a longitudinal sectional view showing an usual apparatus for manufacturing a plastic container coated with a DLC film.
Figure 26:
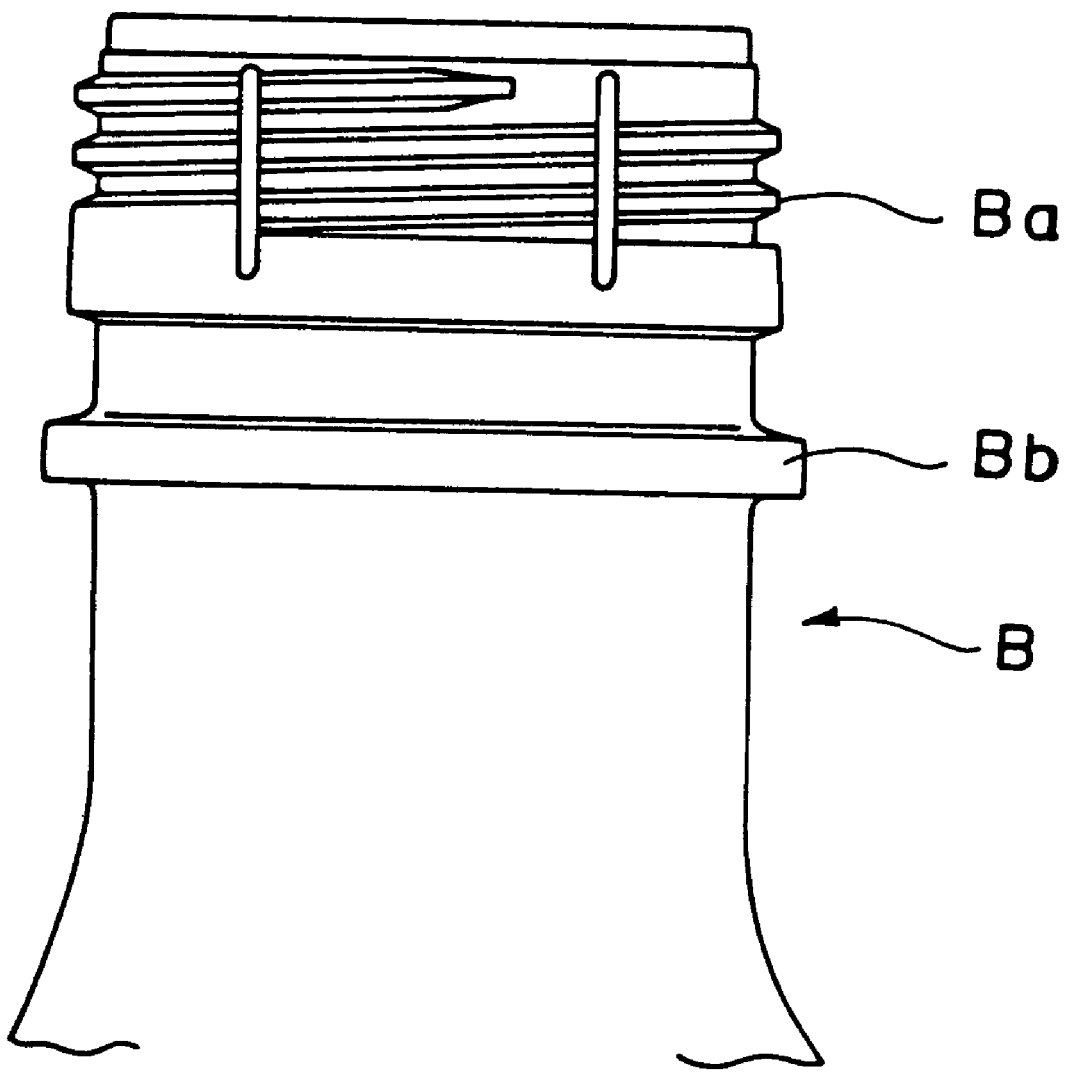
FIG. 26 is a side view showing a part of a plastic container having a supporting ring formed in its opening portion.
Figure 27:
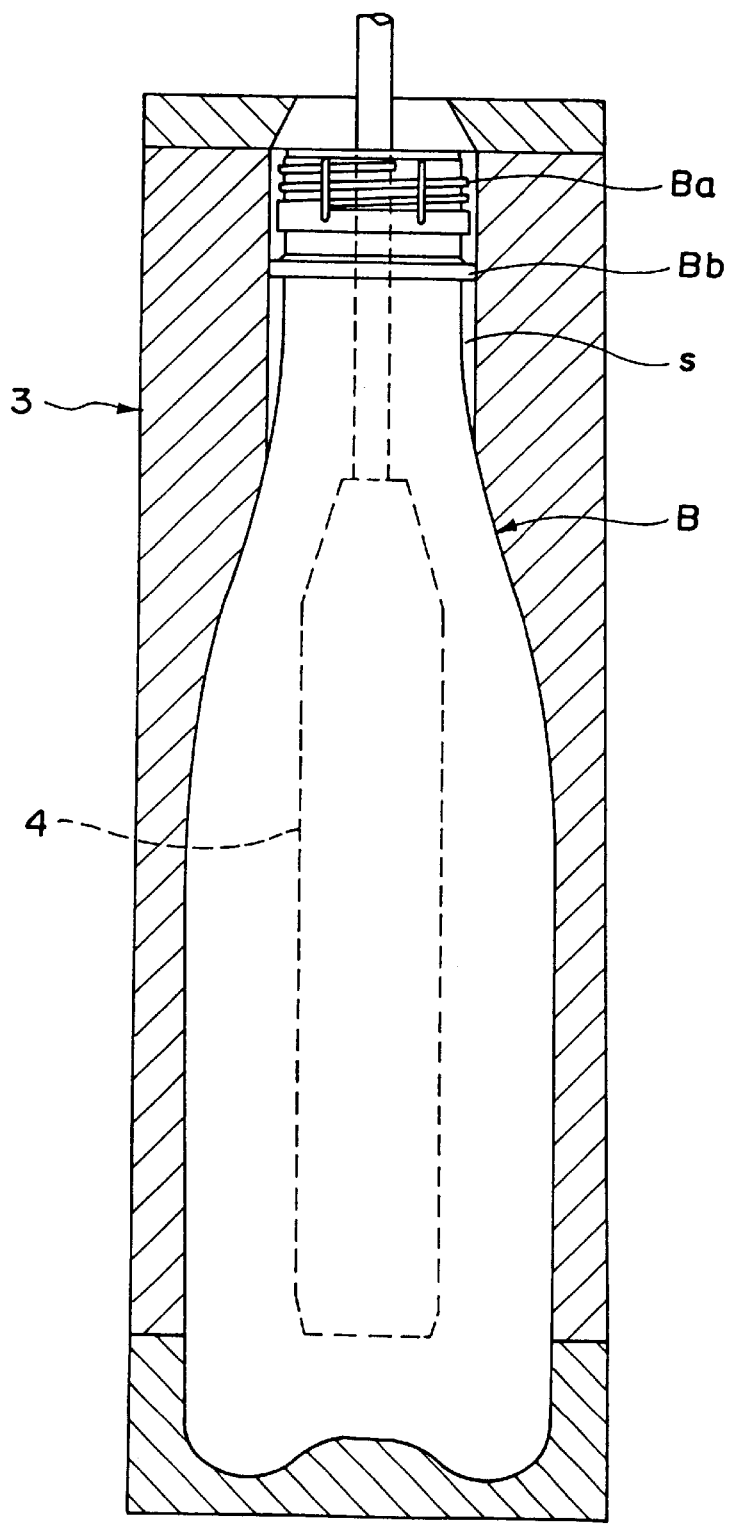
FIG. 27 is a view explaining a state where a DLC film is formed by the usual apparatus for manufacturing a plastic container shown in FIG. 26.

The above operation is comparable to that of the apparatus shown in FIG. 25. However, in the embodiment, an internal diameter of the chamber 10C in an area where the chamber 10C facing an opening portion B' of the plastic container B is comparable to an outside diameter of a supporting ring Bb so that the DLC film can be formed in the plastic container B which has the supporting ring Bb provided in the opening portion B' for preventing the plastic container B from overturning.

In this apparatus, attaching rings 12 and 13 made of copper are prepared, as shown in FIGS. 2 to 5. The gap between the outer surface of the plastic container B inserted into the chamber 10C of the outer electrode 10 and the inner surface of the chamber 10C in a part of the opening portion B', which apart from the supporting ring Bb is filled with the attaching rings 12 and 13.

Figure 2:
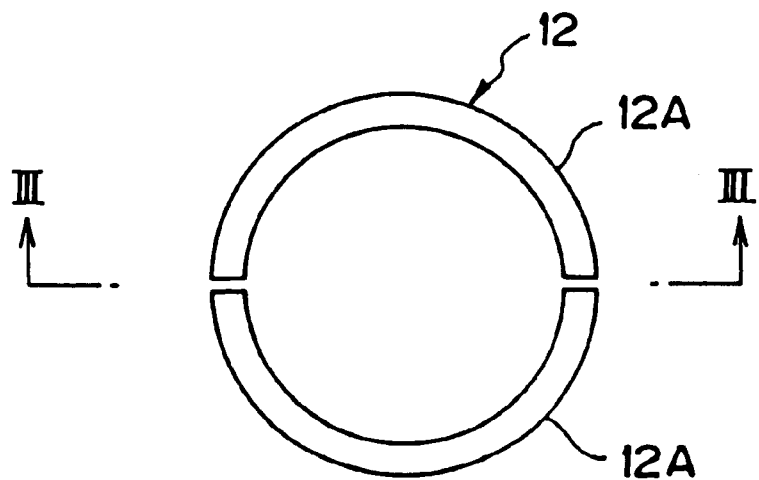
FIG. 2 is a plan view showing an attaching ring used in the apparatus shown in FIG. 1.
Figure 3:
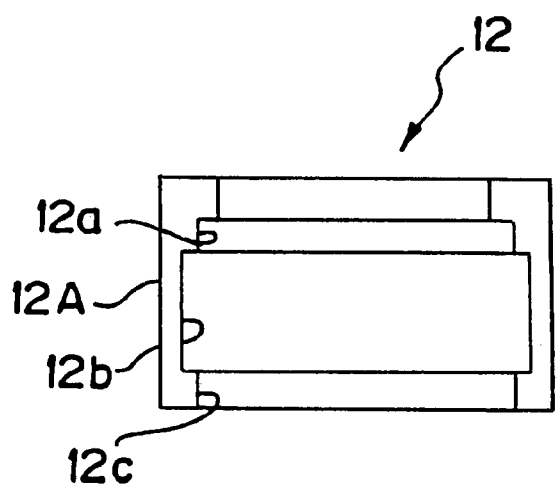
FIG. 3 is a side view showing the attaching ring watched from the direction indicated by a line III—III of FIG. 2.

As shown in FIGS. 2 and 3, the attaching ring 12 is formed in the shape of a tube having openings in its superior extremity and inferior extremity. The attaching ring 12 can be divided into two semicylinder rings 12A.

In inner walls of a pair of the rings 12A, a receiving portion 12a which has an internal diameter comparable to an outside diameter of the container in an area above a screw portion Ba of the opening portion B', a receiving portion 12b which has an internal diameter comparable to an outside diameter of the plastic container B in an area of the screw portion Ba and has width comparable to width of the screw portion Ba, and a receiving portion 12c which has an internal diameter comparable to an outside diameter of the container B in an area under the screw portion Ba of the opening portion B'.

A pair of the rings 12A is attached to a part above the supporting ring Bb from both sides of the part. The receiving portion 12a touches to the part above the screw portion Ba of the opening portion B'. The receiving portion 12b touches to the screw portion Ba. The receiving portion 12c touches to the outer surface of the part under the screw portion Ba. Accordingly, the whole of the outer surface of the opening portion B' is covered by the rings 12A.

Figure 4:
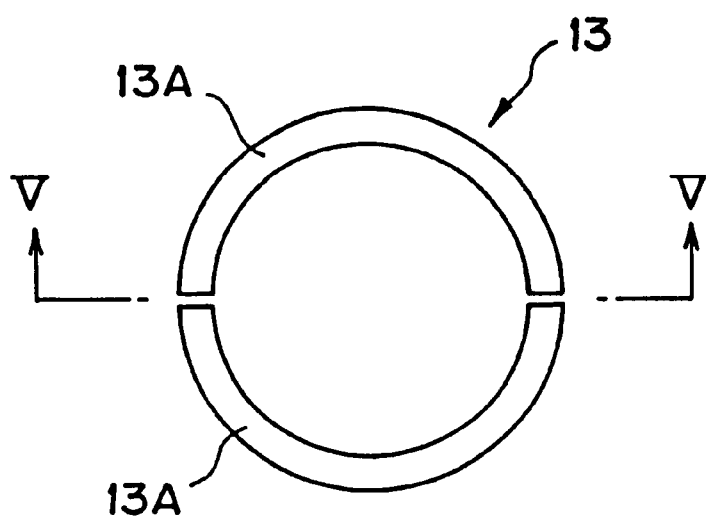
FIG. 4 is a plan view showing another attaching ring of the present invention.
Figure 5:
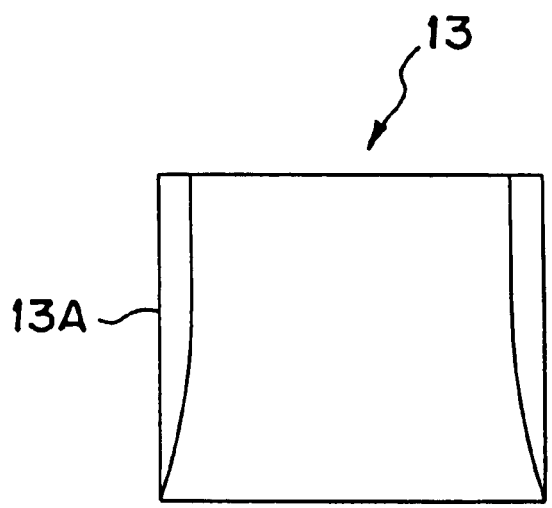
FIG. 5 is a side view showing the attaching ring watched from the direction indicated by a line V—V of FIG. 4.

The attaching ring 13 can be divided into two semicylinder rings 13A, as shown in FIGS. 4 and 5.

An inner wall of each ring 13A is curved; an internal diameter of the ring 13A expands toward the inferior extremity of the ring 13A and the internal diameter of the inferior extremity so that the internal diameter is comparable to an outside diameter of a part under the supporting ring Bb formed in the opening portion B' of the plastic container B.

A pair of the rings 13A is attached to the part under the supporting ring Bb formed in the opening portion B' of the plastic container B from both sides. The inner wall of the rings 13A touches the outer surface of the opening portion B' of the plastic container B with the outer surface of the container B in the area of the opening portion B' being covered by the rings 13A.

An outer diameters of the ring 12 and ring 13 are set so as to be comparable to an outer diameter of the supporting ring Bb formed in the plastic container B, respectively.

When using the above apparatus for manufacturing the plastic container coated with the DLC film, the semicylinder rings 12A are attached to the part above the supporting ring Bb formed in the opening portion B' of the plastic container B in which the DLC film should be formed, from both sides, and the semicylinder rings 13A are attached to the part under the supporting ring Bb from both sides. With the outer surfaces of these parts above and under the supporting ring Bb of the opening portion B' being covered with the rings 12 and the rings 13, the plastic container B is put upright on the lid 10B of the outer electrode 10. And then, by raising the lid 10B, the plastic container B is inserted into the body 10A of the outer electrode 10.

The rings 12 and 13 are connected to each other by a double-wall pressure sensitive adhesive tape stuck to the end faces of the semicylinder rings 12A and 13A. Adhesion by the pressure sensitive adhesive tape prevents the rings 12 and 13 from being removing from the plastic container.

The semicylinder ring 12A and 13A may be connected so as to be prevented from being separated from each other with a protrusion formed in an end face of the ring 12A or 13A and a hole formed in the other end face of the other ring 12A or 13A being engaged with each other when the semicylinder rings 12A and 13A are attached to the opening portion B' of the plastic container B. And furthermore, magnetic material may be attached to the both face ends of the semicylinder rings 12A and 13A facing each other. In this case, the semicylinder rings 12A and 13A is pulled each other by magnetic force which prevents these rings 12A and 13A from being separated mutually.

The plastic container B is inserted into the body 10A with the lid 10B of the electrode 10 being raised, and is received within the chamber 10C which is formed when the lid 10B is stuck to an opening end of the body 10A. When the plastic container B is inserting into the body 10A of the electrode 10, the inner electrode 11 provided in the coaxial position is inserting into the plastic container B from the opening end of the opening portion B'.

In state where the plastic container B is completely received in the chamber 10C, the outer surface of the supporting ring Bb formed in the opening portion B' of the plastic container B and the outer surface of the rings 12 and 13 faces the inner surface of the chamber 10C with no gap formed between these surfaces. And the outer surface of the container B in the area of a shoulder portion and trunk portion, that is the surface of the container B except that of the opening portion B' , faces the inner surface of the chamber 10C with no gap formed between these gap.

After the chamber 10C of the outer electrode 10 is sealed up in the above way, in state where only an extremely slight gap between the inner surface of the chamber 10C and the outer surface of the plastic container B is formed, and furthermore, only an extremely slight gap between the inner surface of the chamber 10C and the outer surface of the rings 12 and 13 is also formed, the chamber 10C is evacuated by the vacuum device (not shown in the figure). And then, material gas (carbon source gas such as aliphatic hydrocarbon gas or aromatic hydrocarbon gas) is spouted into the inner space of the plastic container B through holes (not shown in the figure) formed in the inner electrode After pressure of material gas comes to be a predetermined value, high frequency voltage is given to the outer electrode 10 from the high frequency power source.

Accordingly, plasma is generated between the outer electrode 10 and the inner electrode 11 connected to earth, therefore, the DLC film is formed on the inner surface of the plastic container.

As mentioned above, the DLC film is formed by the plasma CVD method as in the case where the apparatus shown in FIG. 25 is used. In this method, electron is concentrated on the inner surface of the outer electrode 10 which is insulated, therefore, a voltage drop in a predetermined range occurs.

Accordingly, carbon included in material gas is ionized into plus ion and collides exclusively with the inner surface of the plastic container B extended along the inner surface of the outer electrode 10. And then, carbon atoms close to each other are connected so that a compact or fine DLC film is formed on the inner surface of the plastic container B.

As is the same with a state between the shoulder and trunk of the plastic container B and the inner surface of the chamber 10C, the outer surface of the plastic container B in the opening portion B' is touched to the inner surface of the rings 12 and 13 with no or slight gap formed between the outer surface of the rings 12 and 13 and the inner surface of the chamber 10C.

Therefore, no or slight gap is formed between the outer surface of the opening portion B' and the inner surface of the chamber 10C. Accordingly, no spots is included in the DLC film which is formed on the inner surface of the container B because condition in which the DLC film is formed in the opening portion B' is comparable to that in the shoulder portion or trunk portion of the container B.

Figure 6:
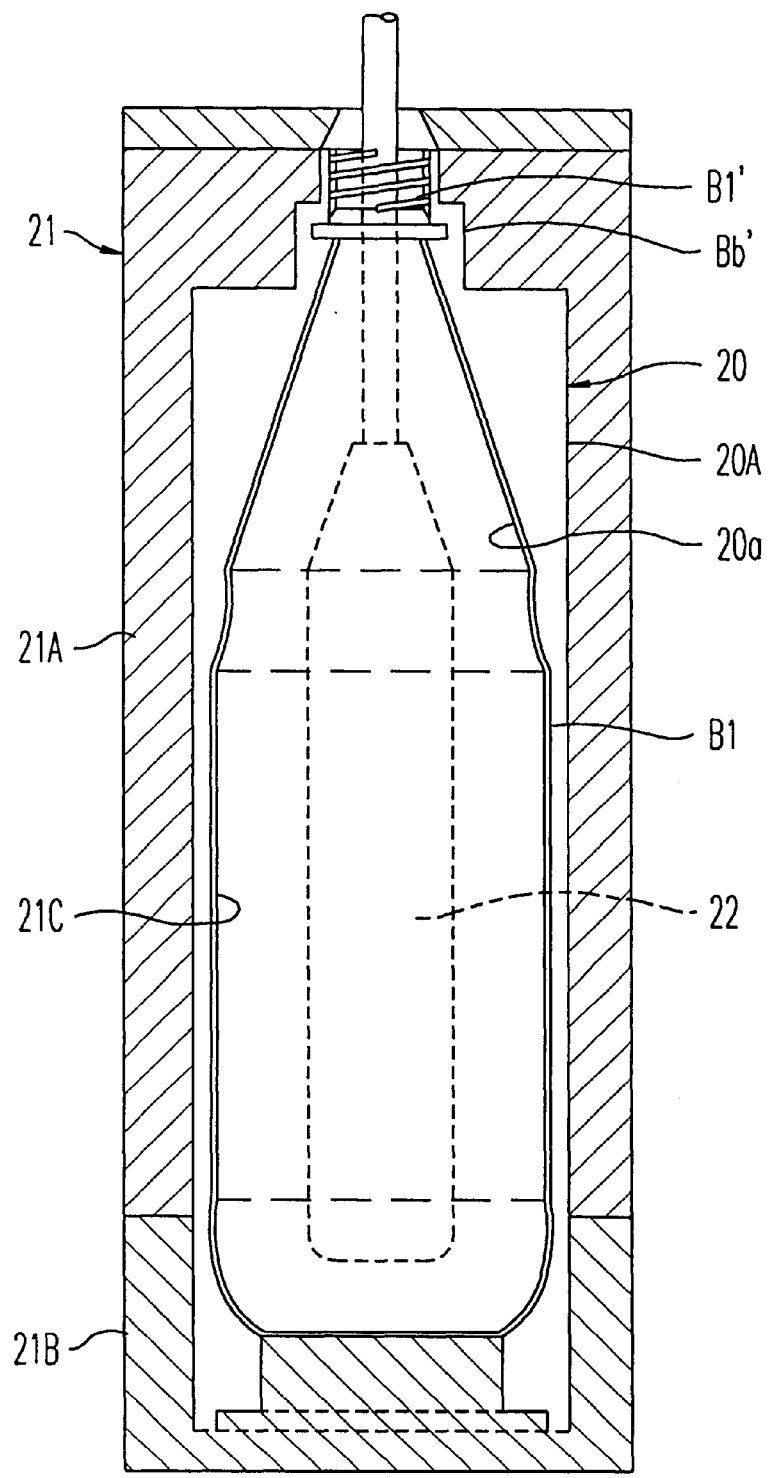
FIG. 6 is a longitudinal sectional view showing another embodiment of an apparatus for manufacturing a plastic container coated with a DLC film.

In FIG. 6, another embodiment of the apparatus for manufacturing the plastic container coated with the DLC film is shown.

In the apparatus shown in FIG. 1, only the outer surface of the opening portion is covered by the attaching rings with the plastic container received in the outer electrode. On the other hand, in the apparatus shown in FIG. 6, the whole of the outer surface of the plastic container B1 is covered by an attaching case 20 when the plastic container B1 is received in the outer electrode 21.

In other words, the attaching case 20 is a member formed in the shape of a cylinder, and can be divided into two semicylinder cases 20A. Each case 20A is formed in the shape of semicylinder.

A pair of the semicylinder case 20A is formed so that the shape of an inner surface 20a of each semicylinder case 20A is comparable to an outline of the plastic container B1. In a part of the surface 20a, where an opening portion B1' of the plastic container B1 is received, a ring-shaped groove 20a' witch can be engaged with a supporting ring Bb1 (refer to FIG. 6) is formed.

Semicylinder cases 20A are attached to the plastic container B1 from both sides with the plastic container B1 completely received within the semicylinder cases 20A. An outer surface of the plastic container B1 is simultaneously touched to the inner surface 20a of the semicylinder case 20A and the supporting ring Bb1 is engaged with a ring-shaped groove 20a' so that the outer surface of the supporting ring Bb1 contacts with an inner surface of the groove 20a'.

The outer electrode 21 is composed of a tubular body 21A and a lid 21B. In the body 21A, a tubular chamber 21C which has a diameter similar to an outside diameter of the attaching case 20 is formed.

In the above apparatus for manufacturing the plastic container coated with the DLC film, after the plastic container B1 is received within the semicylinder cases 20A with a pair of the semicylinder cases 20A being attached to the plastic container B1 to be coated with the DLC film, from both sides, the plastic container B1 to which the attaching case 20 is attached put on the lid 21B in an upright position. When the lid 21B is raised, the plastic container B1 is inserted into the body 21A of the electrode 21. The inner electrode 22 is inserted into the plastic container B1 from the opening portion B1' at the same time.

Then, after the chamber 21C of the outer electrode 21 is sealed up, plasma discharge is generated between the outer electrode 21 and the inner electrode 22 so as to form the DLC film on the inner surface of the plastic container B1.

In this case, there is hardly any gap between the plastic container B1 received within the chamber 21C of the outer electrode 21 and the inner surface of the attaching case 20. There is also hardly any gap between the outer surface of the attaching case 20 and the inner wall of the chamber 21C of the outer electrode 21. Accordingly, there is hardly any gap between the plastic container B1 and the outer electrode 21. Therefore, there is no possibility that the DLC film has some spots because the DLC film can be formed in the same condition in the whole of the plastic container In the above apparatus, the plastic container B1 in which the DLC film should be formed is completely covered with the attaching case 20 so that a gap between the outer surface of the plastic container B1 and the inner surface of the outer electrode 21 is narrower. As a result, generation of spots in the DLC film formed in the plastic container is more certainly prevented and the DLC film can be formed in all sorts of plastic containers having various shapes.

Figure 8:
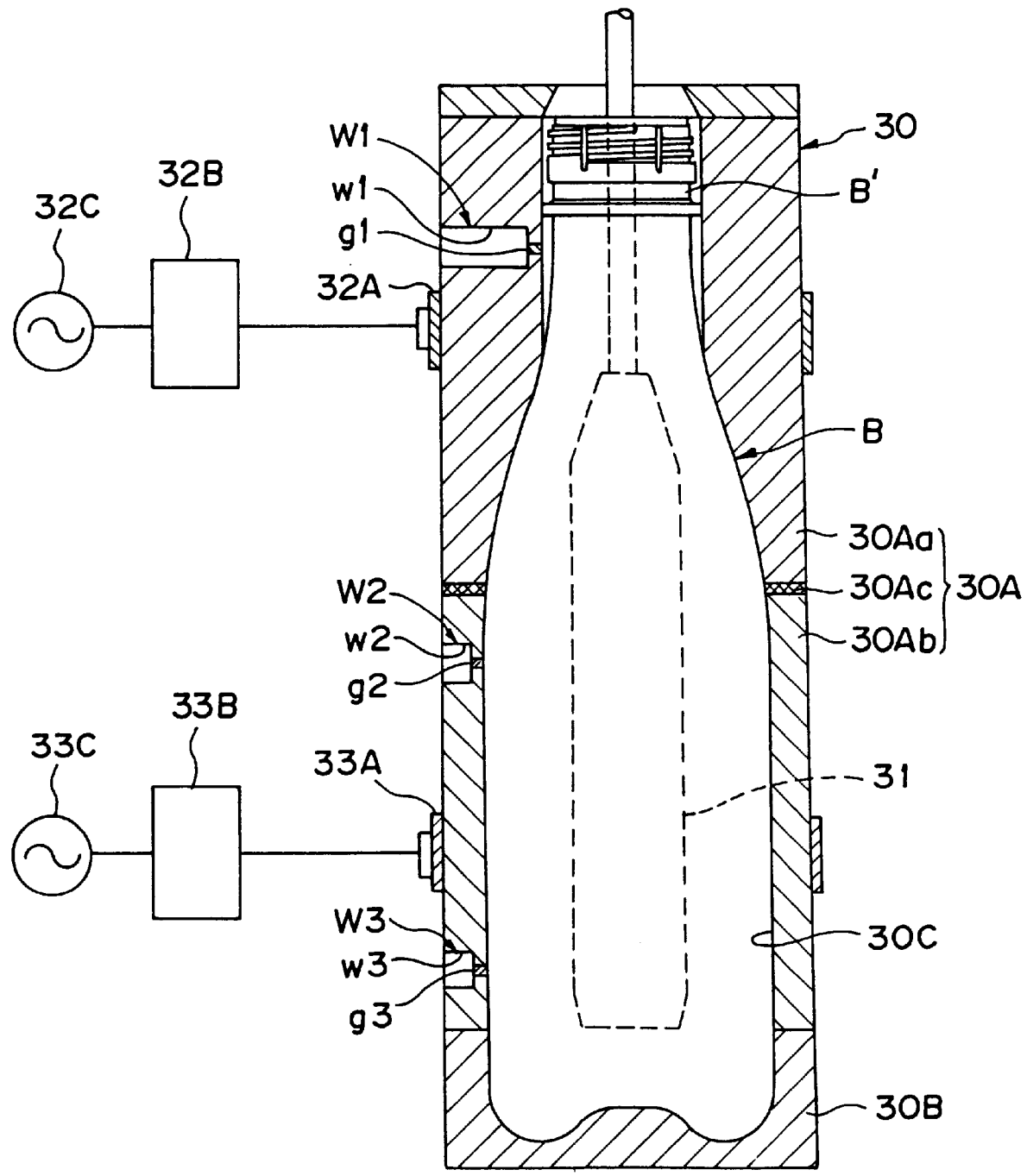
FIG. 8 is a longitudinal sectional view showing another embodiment of an apparatus for manufacturing a plastic container coated with a DLC film.

In FIG. 8, another embodiment of an apparatus for manufacturing the plastic container coated with the DLC film is shown. In this apparatus, an outer electrode 30 is composed of a body 30A and a lid 30B. The body 30A is divided into two parts, an upper part 30Aa and a lower part 30Ab, by a plane perpendicular to the axis of the outer electrode 30.

An ring-shaped insulating plate 30Ac is attached between the upper part 30Aa and the lower part 30Ab. The insulating plate 30Ac is bonded firmly to both the upper part 30Aa and the lower part 30Ab via dividing faces of the upper part 30Aa and the lower part 30Ab. Therefore, the body 30A of the electrode 30 is formed in a body, and the upper part 30Aa and the lower part 30Ab are insulated by the insulating plate 30Ac mutually.

The insulating plate 30Ac is suitably made of ceramics because heat resistance property and compressive strength in proportion to a size or weight of the outer electrode 30 are demanded. Using of high polymer materials is usually restricted because compressive strength of high polymer materials is usually low. However, a material having heat resistance property such as Teflon can be used as the insulating plate 30.

Within the outer electrode 30 composed of the body 30A and the lid 30B, a chamber 30C is formed in a shape comparable to the outline of the plastic container B in which the DLC film should be formed. The reference numeral "31" in FIG. 8 represents an inner electrode which is inserted into the plastic container B when the plastic container B is received within the chamber 30C. The shape of the inner electrode 31 is comparable to that of the inner surface of the plastic container B.

A copper plate 32A formed in the shape of a band is wound onto an outer surface of the upper part 30Aa of the body 30A. A high frequency power source 32C is connected to the copper plate 32A via a matching box (matching circuit) 32B for giving electric power to the upper part 30Aa from the high frequency power source 32C.

A copper plate 33A formed in the shape of a band is wound onto an outer surface of the lower part 30Ab of the body 30A. A high frequency power source 33C is connected to the copper plate 33A via a matching box (matching circuit) 33B for giving electric power to the lower part 30Ab from the high frequency power source 33C. As mentioned above, giving electric power to the upper part 30Aa and that to the lower part 30Ab can be carried out separately.

In the above apparatus for manufacturing the plastic container coated with the DLC film, the plastic container B in which the DLC film should be formed is put on the lid 30B in an upright position. The lid 30B is raised so as to insert the container B into the body 30A of the outer electrode 30. An inner electrode 31 positioned in a coaxial position in the body 30A is inserted into the plastic container B via a mouth of the opening portion B' at the same time.

Accordingly, after the plastic container B is received within the chamber 30C and the chamber 30C is evacuated, a material gas is supplied into the plastic container B and electric power is given to the upper part 30Aa of the outer electrode 30 from the high frequency power source 32C via the matching box 32B and the copper plate 32A. And then, plasma is generated between the upper part 30Aa and the inner electrode 31 for forming the DLC film on the inner surface of the opening portion B' and shoulder portion of the plastic container B.

Electric power is also given to the lower part 30Ab of the outer electrode 30 from the high frequency power source 33C via the matching box 33B and the copper plate 33A. Plasma is generated between the lower part 30Ab and the inner surface of the trunk portion of the plastic container B. Therefore, the DLC film is formed on the inner surface of the trunk portion of the plastic container B.

As mentioned above, the body 30A of the outer electrode 30 is divided into the upper part 30Aa facing to the opening portion and shoulder portion of the plastic container B, and the lower part 30Ab facing to the trunk portion of the plastic container B. And furthermore, electric power is given to these parts separately in state where these parts are insulated mutually. As the result, for example, in the case where the opening portion of the plastic container B is slender and a gap between the outer electrode 30 and the inner electrode 31 in an area from the opening portion to the shoulder portion of the plastic container B is smaller than that in an area of the trunk portion of the plastic container B, the matching box can be adjusted so that electric power given to the upper part 30Aa from the high frequency power source 32C is smaller than that given to the lower part 30Ab from the high frequency power source 33C. By such an adjustment, concentration of heat by plasma into the area from the shoulder part to the opening portion, where the gap between the outer electrode 30 and the inner electrode 31 is small can be prevented. So, the DLC film can be formed in state where the DLC film has no spots and the opening portion of the plastic container B is not deformed by heat of plasma.

Other adjusting methods can be adopted instead of adjusting the matching boxes 32B and 33B in order to reduce electric power supplied from the high frequency power source 32C under that supplied from the high frequency power source 33C. For example, time for giving electric power from the high frequency power source 32C may be shorter than time for giving electric power from the high frequency power source 33C in order to prevent generation of spots in the DLC film or deformation of the plastic container B by heat of plasma.

In FIG. 8, a view port W1 is provided on a wall of the upper part 30Aa of the outer electrode 30. And two view ports W2 and W3 are provided on a wall of the lower part 30Ab.

The view ports W1, W2 and W3 are constructed in a manner that attaching heat-proof quartz glasses g1, g2 and g3 are attached into the holes w1, w2 and w3 formed in the walls of the upper part 30Aa and the lower part 30Ab. Through the view ports W1, W2 and W3, the condition of plasma in the chamber 30C can be observed from the outside with the chamber 30C being sealed up.

In FIG. 8, a view port is provided in a spot in the upper part 30Aa and view ports are provided in two spots in the lower part 30Ab. However, such a view port can be provided in any spots of the upper part 30Aa and the lower part 30Ab, and the number of the view ports can be selected at will. The apparatus for manufacturing the plastic container coated with the DLC film shown in FIG. 1 can be also provided with such a view port.

Figure 9:
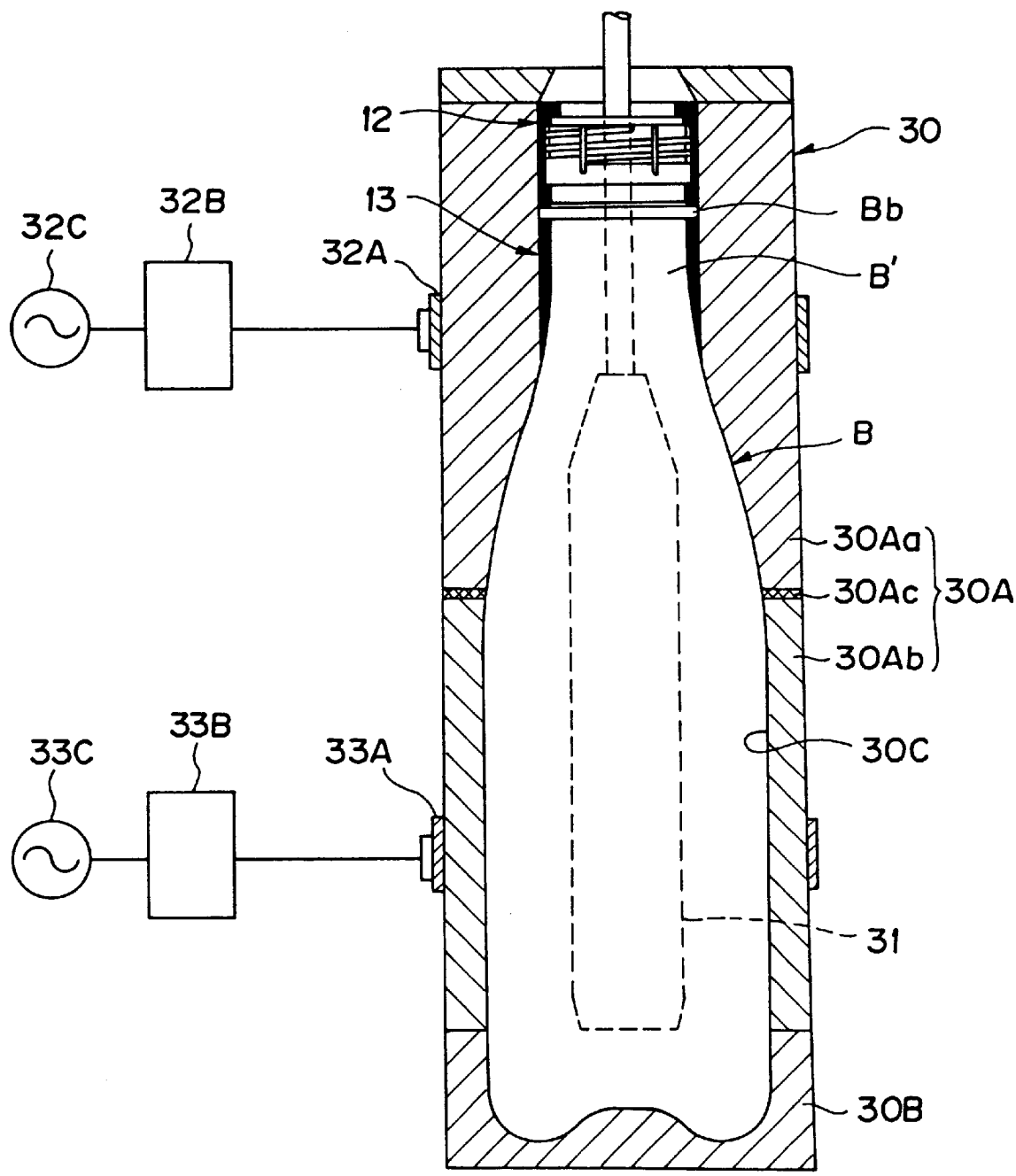
FIG. 9 is a longitudinal sectional view showing another embodiment of an apparatus for manufacturing a plastic container coated with a DLC film.

In FIG. 9, an embodiment of an apparatus for manufacturing the plastic container coated with the DLC film, in which the attaching rings 12 and 13 used in the apparatus shown in FIG. 1 is applied to the above apparatus shown in FIG. 8, is shown. In this embodiment of the apparatus, when the plastic container having the supporting ring Bb in the opening portion B' is inserted into the chamber 30C of the outer electrode 30, the attaching rings 12 and 13 are attached to an upper area and a lower area of the supporting ring Bb formed in the opening portion B', respectively.

In the apparatus shown in FIG. 9, as the apparatus shown in FIG. 8, the body 30A of the outer electrode 30 is divided into the upper part 30Aa and the lower part 30Ab which are insulated by the insulating plate 30Ac mutually. Therefore, adjusting strength of electric power or time for supplying electric power given to the upper part 30Aa and the lower part 30Ab can prevent concentration of plasma. And furthermore, generation of spots in the DLC film formed in the plastic container B can be more completely prevented because there is hardly any gap between the inner surface of the outer electrode 30 and the outer surface of the plastic container in an area of the opening portion having the supporting ring Bb.

Figure 10:
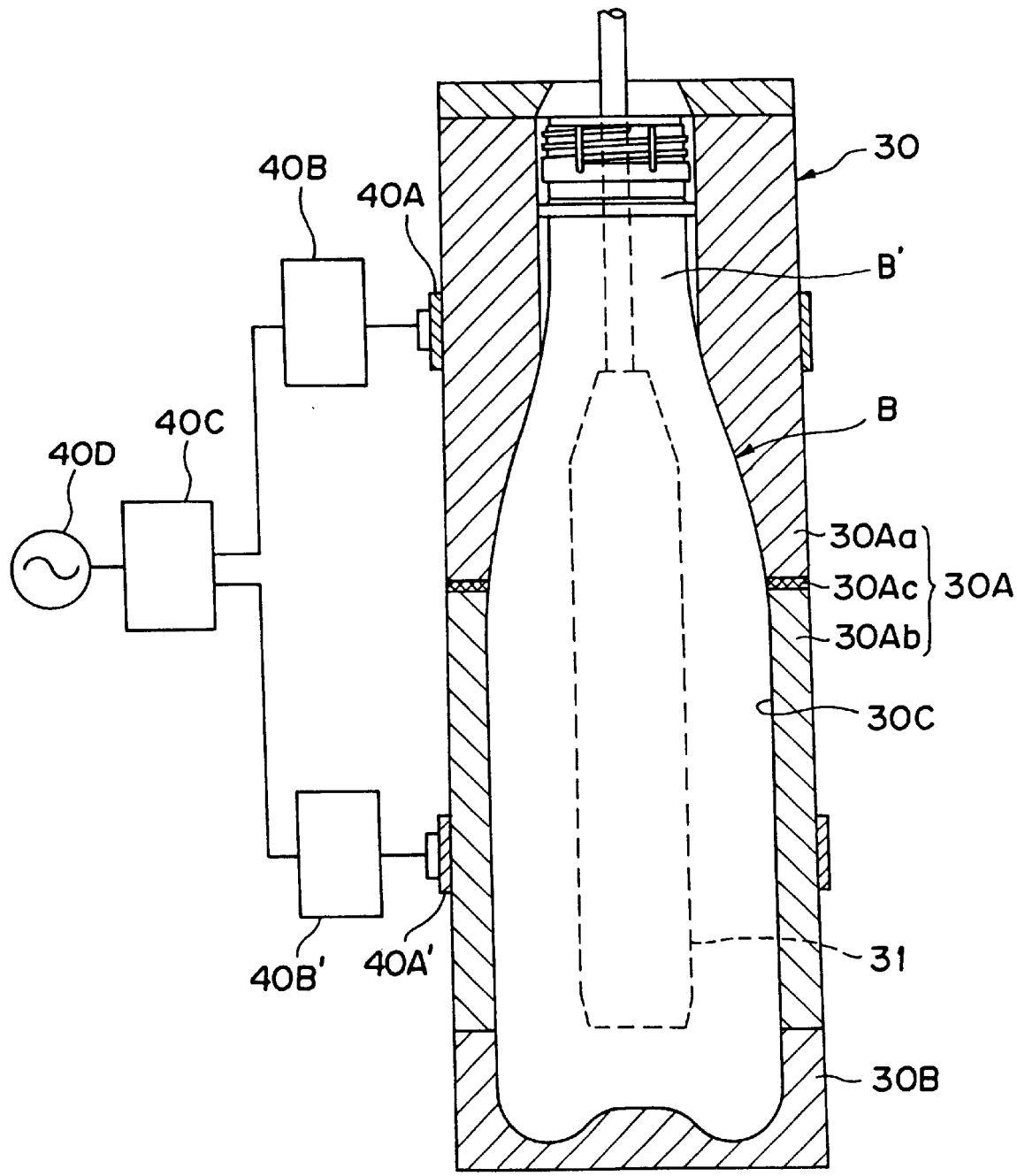
FIG. 10 is a longitudinal sectional view showing another embodiment of an apparatus for manufacturing a plastic container coated with a DLC film.

In FIG. 10, another embodiment of an apparatus for manufacturing the plastic container coated with the DLC film is shown. In this embodiment of the apparatus, the body 30A of the outer electrode 30 is divided into the two parts, the upper part 30Aa and the lower part 30Ab, between which the insulating plate 30Ac is attached. And, the apparatus has also the inner electrode. Such structure of the apparatus or the like is the same with the apparatus shown in FIG. 8.

A copper plate 40A formed in the shape of a band is wound onto an outer surface of the upper part 30Aa of the body 30A. A copper plate 40A' formed in the shape of a band is wound onto an outer surface of the lower part 30Ab of the body 30A. A matching box 40B is connected to the copper plate 40A. A matching box 40B' is connected to the copper plate 40A'.

A high frequency power source 40D is connected to the matching boxes 40B and 40B' via a selector switch 40C.

In the apparatus shown in FIG. 10, as the apparatus shown in FIG. 8, the DLC film is formed on the inner surface of the plastic container B by giving electric power separately to the upper part 30Aa of the outer electrode 30 or the lower part 30Ab of the outer electrode 30. Electric power is given to either the upper part 30Aa or the lower part 30Ab by switching of the selector switch 40C.

In this apparatus, the DLC film is formed on the inner surface of the plastic container B in an area from the opening portion B' to the shoulder portion of the plastic container by giving electric power to the upper part 30Aa from the high frequency power source 40D at first. After a thickness of the DLC film comes to be a predetermined value by the above process, the selector switch 40C is switched to stop giving electric power to the upper part 30Aa.

Electric power is given to the lower part 30Aa from high frequency power source 40D next. After a thickness of the DLC film being formed on the inner surface of the trunk portion of the plastic container B comes to be the same with thickness of the DLC film formed in the inner surface of the plastic container B in an area from the opening portion B' to the shoulder portion, the selector switch 40C is switched to stop giving electric power to the lower part 30Ab.

Switching operation of the selector switch 40C can be controlled by a microcomputer connected to the selector switch 40C.

In the above way, the DLC film is formed on the whole of the inner surface of the plastic container B. The DLC film is formed on the inner surface of the plastic container B separately in the area from the opening portion B' to the shoulder portion and the area of the trunk portion. Accordingly, generation of spots in the DLC film by concentration of plasma into the area where a gap between the outer electrode and the inner electrode is narrow is prevented when electric power is given, as is similar to the case where the apparatus shown in FIG. 8 is used. And furthermore, the apparatus comes to be inexpensive because only one high frequency power source is necessary, by which electric power can be given to the divided parts of the outer electrode 30.

In the apparatus shown in FIG. 10, electric power can be given to the lower part 30Ab at first before electric power is given to the upper part 30Aa.

In order to get uniform thickness of the DLC film formed on the inner surface of the whole of the plastic container B, timing of switching the selector switch 40C may be adjusted (time for giving electric power to the upper part 30Aa where the gap between the outer electrode 30 and the inner electrode is narrow may be shorter than time for giving electric power to the lower part 30Ab) so that electric power given to the upper part 30Aa comes to be comparable to that given to the lower part 30Ab, by adjusting the matching boxes 40B and 40B'. Strength of electric power given to the upper part 30Aa and the lower part 30Ab may be adjusted by adjusting the matching boxes 40B and 40B' (strength of electric power given to the upper part 30Aa may be smaller than that to the lower part 30Ab).

Figure 11:
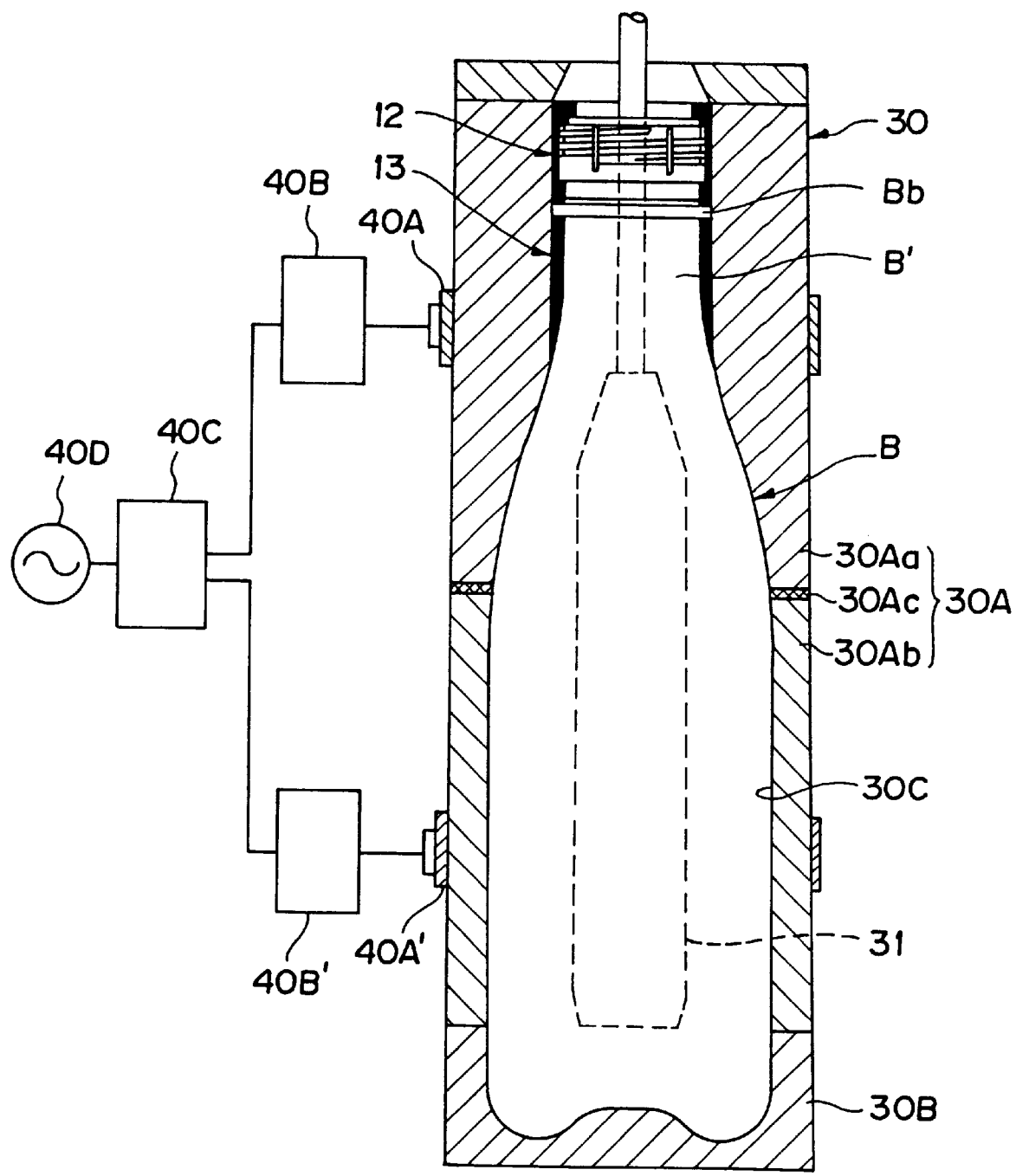
FIG. 11 is a longitudinal sectional view showing another embodiment of an apparatus for manufacturing a plastic container coated with a DLC film.

In FIG. 11, an embodiment of an apparatus is shown. In this apparatus, the attaching rings 12 and 13 used in the apparatus shown in FIG. 1 are applied to the apparatus for manufacturing the plastic container coated with the DLC film shown in FIG. 10. In this apparatus of FIG. 11, the attaching rings 12 and 13 are attached to the upper area and the lower area of the supporting ring Bb formed in the opening portion B' of the plastic container B, respectively, when the plastic container having the supporting ring Bb formed in the opening portion B' is inserted into the chamber 30C of the outer electrode 30. In this apparatus, forming a gap between the container B and the inner surface of the outer electrode 30 in the area of the opening portion B' having the supporting ring Bb is prevented, in addition to the function of the apparatus shown in FIG. 10. So, generating of spots in the DLC film formed in the plastic container is still more completely prevented.

Figure 12:
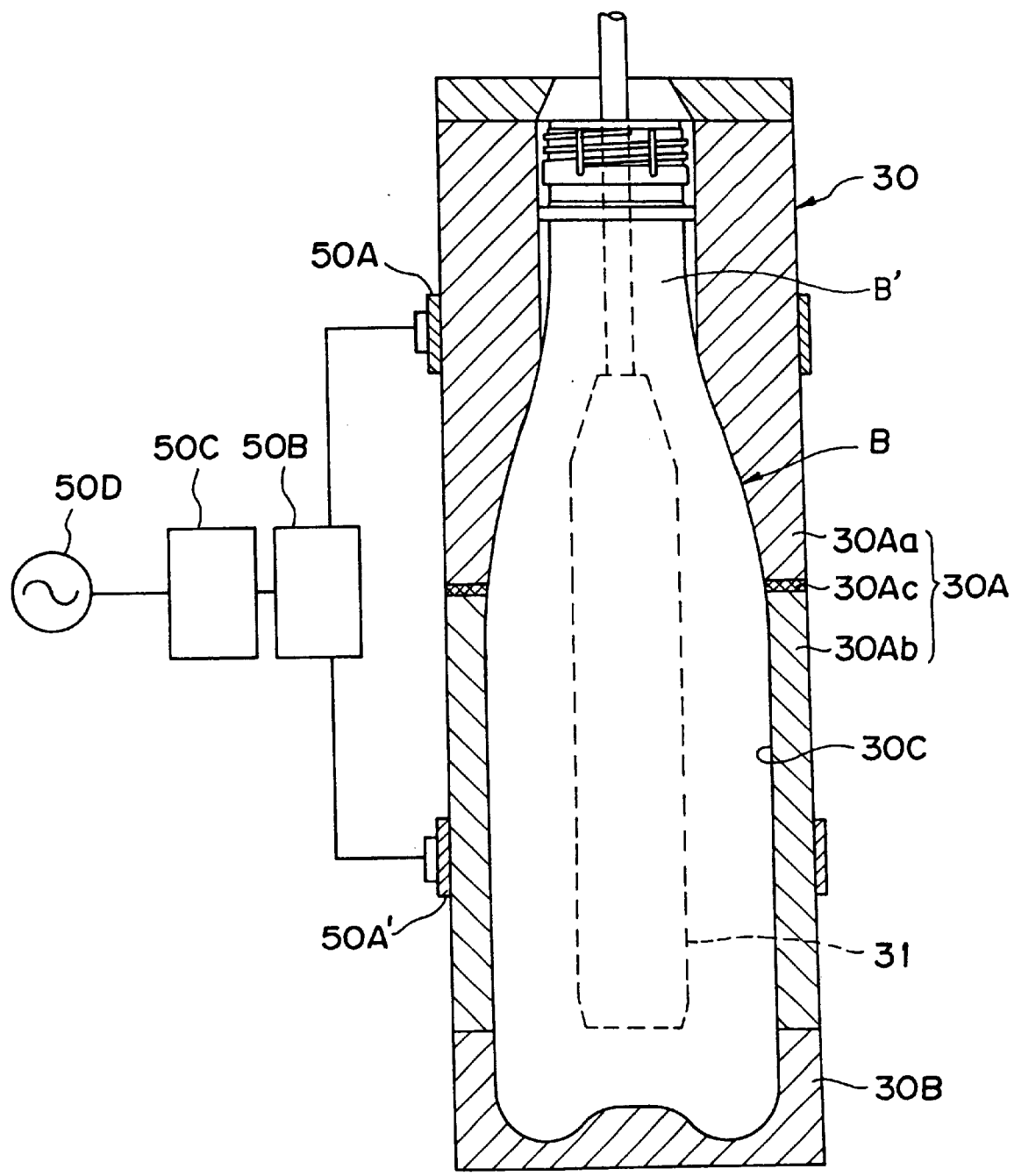
FIG. 12 is a longitudinal sectional view showing another embodiment of an apparatus for manufacturing a plastic container coated with a DLC film.

In FIG. 12, another embodiment of an apparatus for manufacturing the plastic container coated with the DLC film is shown. In this apparatus, the body 30A of the outer electrode 30 is divided into the upper part 30Aa and the lower part 30Ab. The insulating plate 30Ac is attached between the upper part 30Aa and the lower part 30Ab so as to insulate these parts mutually. The apparatus has also the inner electrode 31. Such a construction corresponds to that of the apparatus shown in FIG. 8. A copper plate 50A is wound onto the outer surface of the upper part 30Aa and a copper plate 50A' is wound onto the outer surface of the lower part 30Ab, as the apparatus shown in FIG. 8.

A matching box 50C is connected to the copper plate 50A wound onto the upper part 30Aa and the copper plate 50A' wound onto the lower part 30Ab via a selector switch 50B, respectively. And furthermore, a high frequency power source 50D is connected to the matching box 50C.

In the apparatus shown in FIG. 12, the DLC film is formed on the inner surface of the plastic container B received within the chamber 30C by giving electric power to the upper surface 30Aa and the lower surface 30Ab of the outer electrode 30, respectively. By switching the selector switch 50B, electric power supplied from the high frequency power source 50D via the matching box 50C is given to the upper part 30Aa and the lower part 30Ab in order.

In this apparatus, when electric power of the matching box 50C is fixed so that a level of electric power outputted from the matching box 50C is constant, timing of switching the selector switch 50B is set to correspond to the gap between the outer electrode 30 and the inner electrode 31 in the corresponding area. That is to say, timing of switching the selector switch 50B is set so that time for giving electric power to the upper part 30Aa where the gap between the outer electrode 30 and the inner electrode 31 is narrow is shorter than that to the lower part 30Ab. Accordingly, thickness of the DLC film formed on the inner surface of the plastic container B in the area from the opening portion B' to the shoulder portion of the plastic container B can come to be comparable to that in the area of the trunk portion of the plastic container B.

When timing of the switching is set so that time for giving electric power to the upper part 30Aa is equivalent to that to the lower part 30Ab, electric power corresponding to a gap in the areas of the upper part 30Aa and the lower part 30Ab is outputted to the upper part 30Aa and the lower part 30Ab, respectively. That is, electric power given to the upper part 30Aa where the gap is small is set smaller than that to the lower part 30Ab. In this case, thickness of the DLC film formed on the inner surface of the plastic container B in the area from the opening portion B' to the shoulder portion of the plastic container B can come to be comparable to that in the area of the trunk portion of the plastic container B, also.

In the above way, the DLC film can be formed on the inner surface of the whole of the plastic container B without any spots. In this apparatus shown in FIG. 12, the price can be reduced because electric power can be given to both the upper part 30Aa and the lower part 30Ab in predetermined time by using only one high frequency power source and only one matching box.

In the apparatus shown in FIG. 12, at first, electric power can be given to either the upper part 30Aa or the lower part 30Ab.

Figure 13:
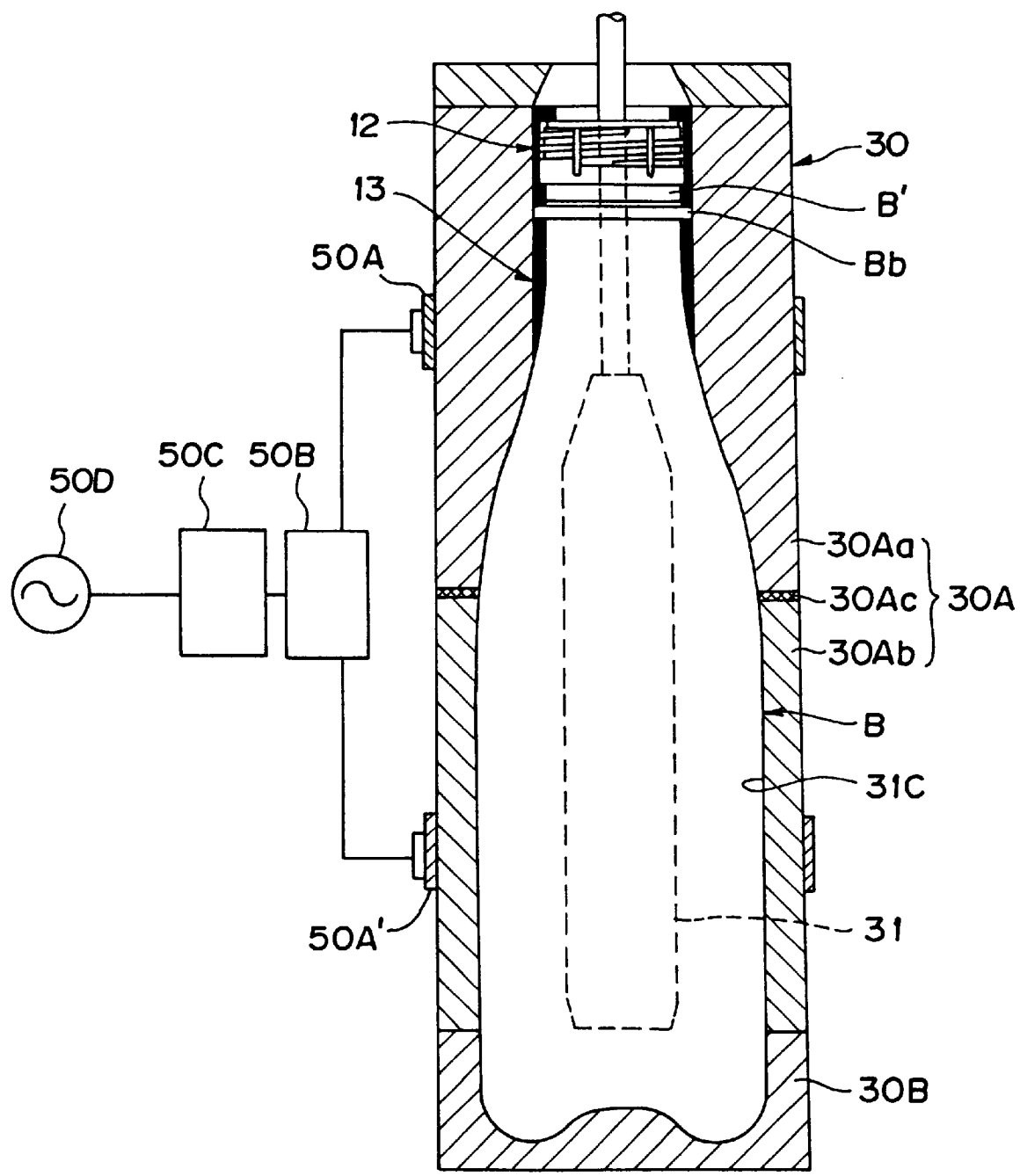
FIG. 13 is a longitudinal sectional view showing another embodiment of an apparatus for manufacturing a plastic container coated with a DLC film.

In FIG. 13, an embodiment of an apparatus in which the attaching rings 12 and 13 shown in FIG. 1 are applied to the apparatus for manufacturing the plastic container coated with the DLC film shown in FIG. 12 is shown. In this apparatus, the gap formed between the outer surface of the opening portion B' of the plastic container B having the supporting ring Bb and the inner surface of the outer electrode 30 is filled with conductive material which is the attaching rings 12 and 13 attached to the upper area and the lower area of the supporting ring Bb formed in the opening portion B' of the plastic container B. Accordingly, generation of spots in the DLC film when forming the DLC film is more completely prevented.

In each apparatus shown in FIGS. 8 to 13, the outer electrode 30 is divided into the upper part 30Aa and the lower part 30Ab. However, the outer electrode 30 can be divided into more than two parts and electric power corresponding a gap between the outer electrode 30 and the inner electrode 31 in the corresponding area can be given to each one of the divided parts, in accordance with the shape of the container. In this case, generation of spots in the DLC film and deformation of the plastic container can be prevented more efficiently.

Figure 7:
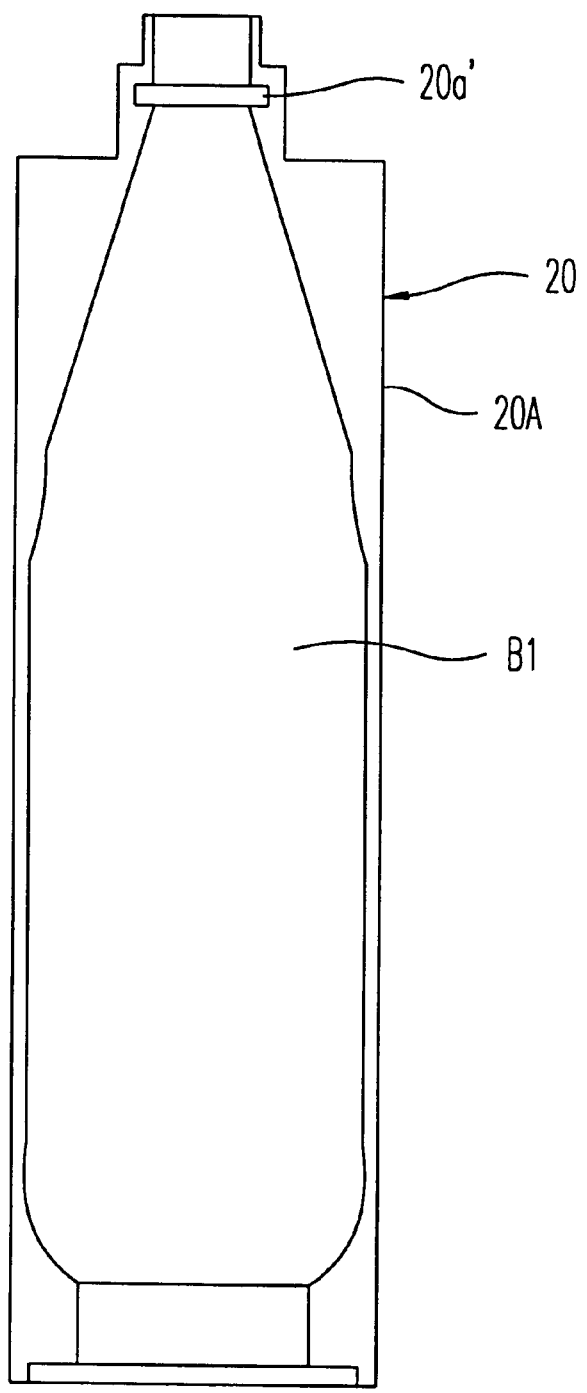
FIG. 7 is a side view showing a attaching case in the apparatus shown in FIG. 6.

In the above apparatuses shown in FIGS. 9, 11 and 13, the attaching case 20 shown in FIGS. 6 and 7 may be used instead of the attaching rings 12 and 13 shown in FIGS. 2 to 5.

Figure 14:
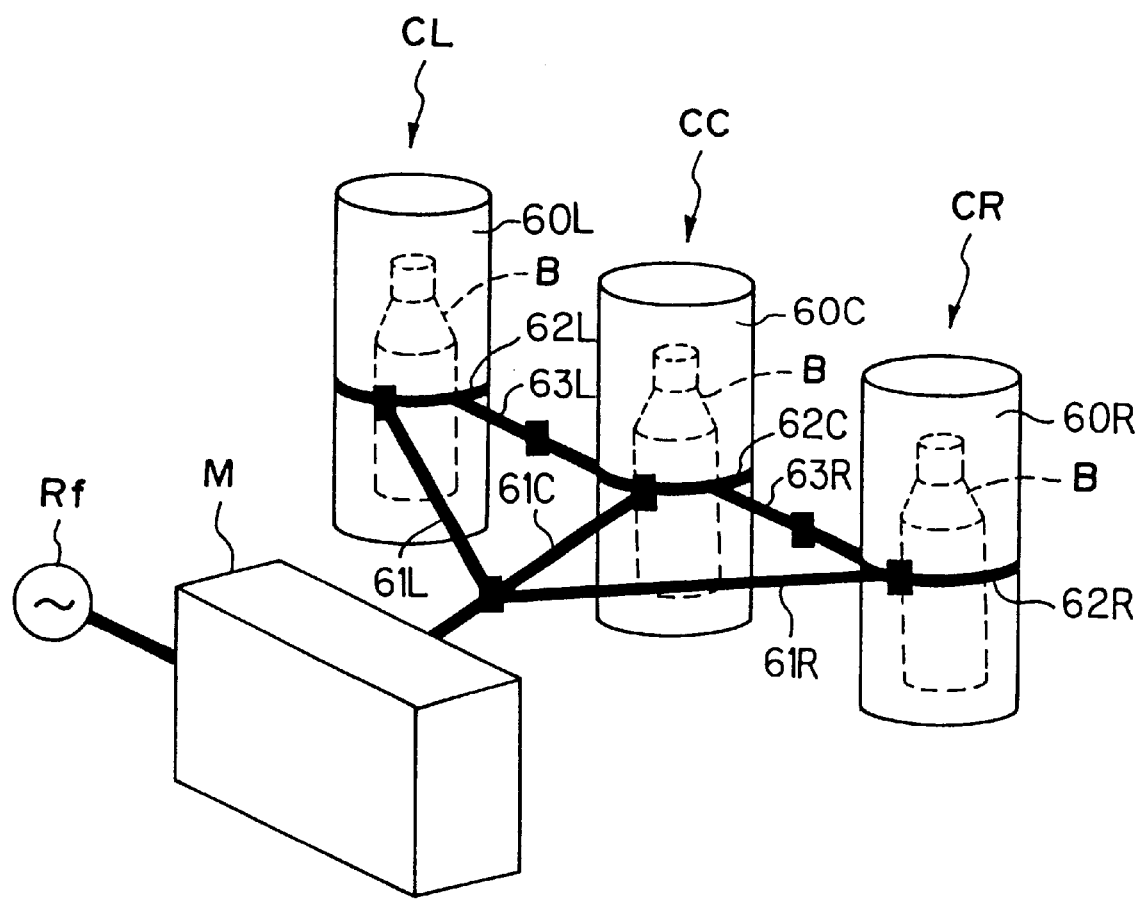
FIG. 14 is a schematic perspective view showing another embodiment of an apparatus for manufacturing a plastic container coated with a DLC film.

In FIG. 14, another embodiment of an apparatus for manufacturing the plastic container coated with the DLC film is shown.

Figure 28:
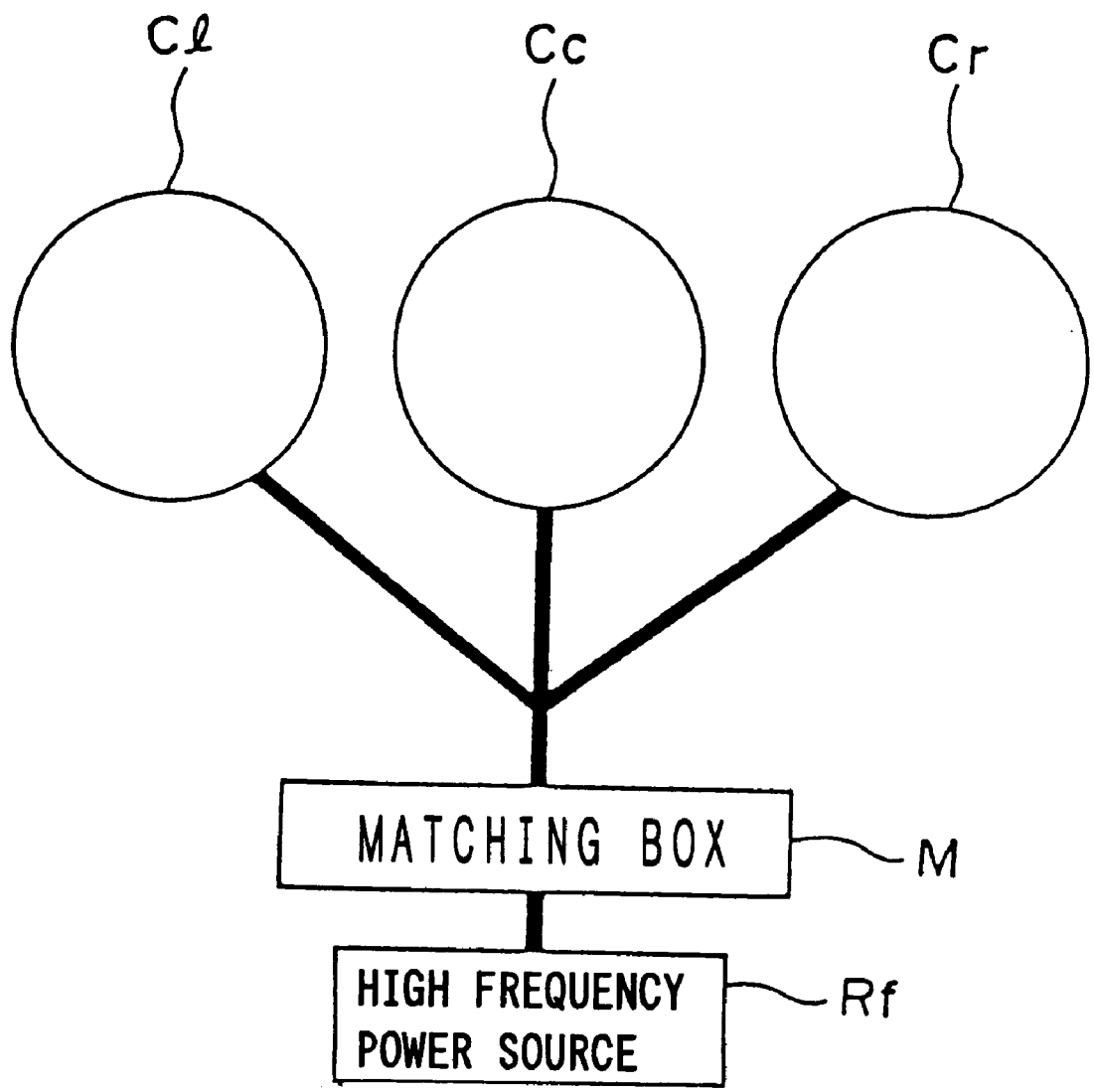
FIG. 28 is a schematic view showing a state where plural outer electrodes is connected to a high frequency power source.

As shown in FIG. 14, plural chambers (three chambers CR, CC and CL are shown in the figure) are arranged in a line as the apparatus shown in FIG. 28. A high frequency power source Rf is connected to outer electrodes 60R, 60C and 60L which compose the chambers by using wires 61R, 61C and 61L via a matching box M, respectively.

The connections of the wires 61R, 61C and 61L to the outer electrodes 60R, 60C and 60L are achieved by the tips of the outer electrodes 60R, 60C and 60L attached to copper plates 62R, 62C and 62L wound onto the outer surfaces of the outer electrodes 60R, 60C and 60L, respectively.

The outer electrodes 60R and 60C are connected with the copper plates 62R and 62C short-circuited with a wire 63R. The outer electrodes 60C and 60L are connected with the copper plates 62C and 62L short-circuited with a wire 63L.

In the apparatus shown in FIG. 14, the plastic containers B are received in the chambers CR, CC and CL, respectively. After the chambers CR, CC and CL are evacuated by exhausting, material gas is supplied into each plastic container B. After that, electric power is given to each outer electrode 60R, 60C and 60L from the high frequency power source Rf via the matching box M so that the DLC film is formed on the inner surface of each plastic container B by plasma generated between the inner electrode and the inner surface of the plastic container B received within each chamber CR, CC and CL.

Since the wire 63R connects the outer electrodes 60R and 60C, and the wire 63L connects the outer electrodes 60C and 60L, electric power can be distributed almost even to the outer electrodes 60R, 60C and 60L from the high frequency power source Rf. Accordingly, the plastic containers coated with the DLC films in which the conditions of the DLC films are almost the same is manufactured at the same time when condition for coating the DLC film, such as vacuum condition and charge rate of material gas, is controlled so that there is no difference in condition for coating the DLC film between these chambers CR, CC and CL.

In the apparatus, the outer electrodes 60R, 60C and 60L are short-circuited with wires 63R and 63L as mentioned above. If the outer electrodes 60R, 60C and 60L are not short-circuited, electric power is not evenly divided into these outer electrodes 60R, 60C and 60L from the high frequency power source Rf because electric power given to the outer electrode 60C positioned in the center tends to be larger than other outer electrodes. Therefore, thickness of the DLC films formed in the plastic container B comes to be uneven if the outer electrodes 60R, 60C and 60L are not short-circuited.

It is thought that such dispersion of given electric power between these chambers CR, CC and CL is caused by difference in value of resistance between the wires 61R, 61C and 61L which connects the high frequency power source Rf with the outer electrodes 60R, 60C and 60L, respectively.

Therefore, the inventor carried out experimentation in which length of each wire 61R, 61C and 61L is set to be the same. However, it is difficult that setting condition of the wires 61R, 61C and 61L made to be the same, and electric power could not be given even to the chambers CR, CC and CL because of difference in connecting resistance of connecting parts where the wires 61R, 61C and 61L are connected to the copper plates 62R, 62C and 62L or difference in curve resistance caused by bending of the wires 61R, 61C and 61L or the like.

On the basis of such experimentation, the inventors was informed that short-circuiting the chambers CR, CC and CL with the wires 63R and 63L is the best method for distributing electric power even to the chambers CR, CC and CL. By adopting a circuit shown in FIG. 14, a large quantity of the plastic containers coated with the DLC films can be manufactured at the same time. And furthermore, coating condition of the DLC films of the containers as products is almost even.

In FIG. 14, the case where the three chambers are used is shown. However, by short-circuiting the chambers mutually with wires having low resistance such as copper wires, electric power can be distributed equally to the chambers even if more than three chambers are used so that a large quantity of the plastic containers coated with the DLC films can be manufactured at the same time, in which coating condition of the DLC films of the containers is almost even.

Figure 15:
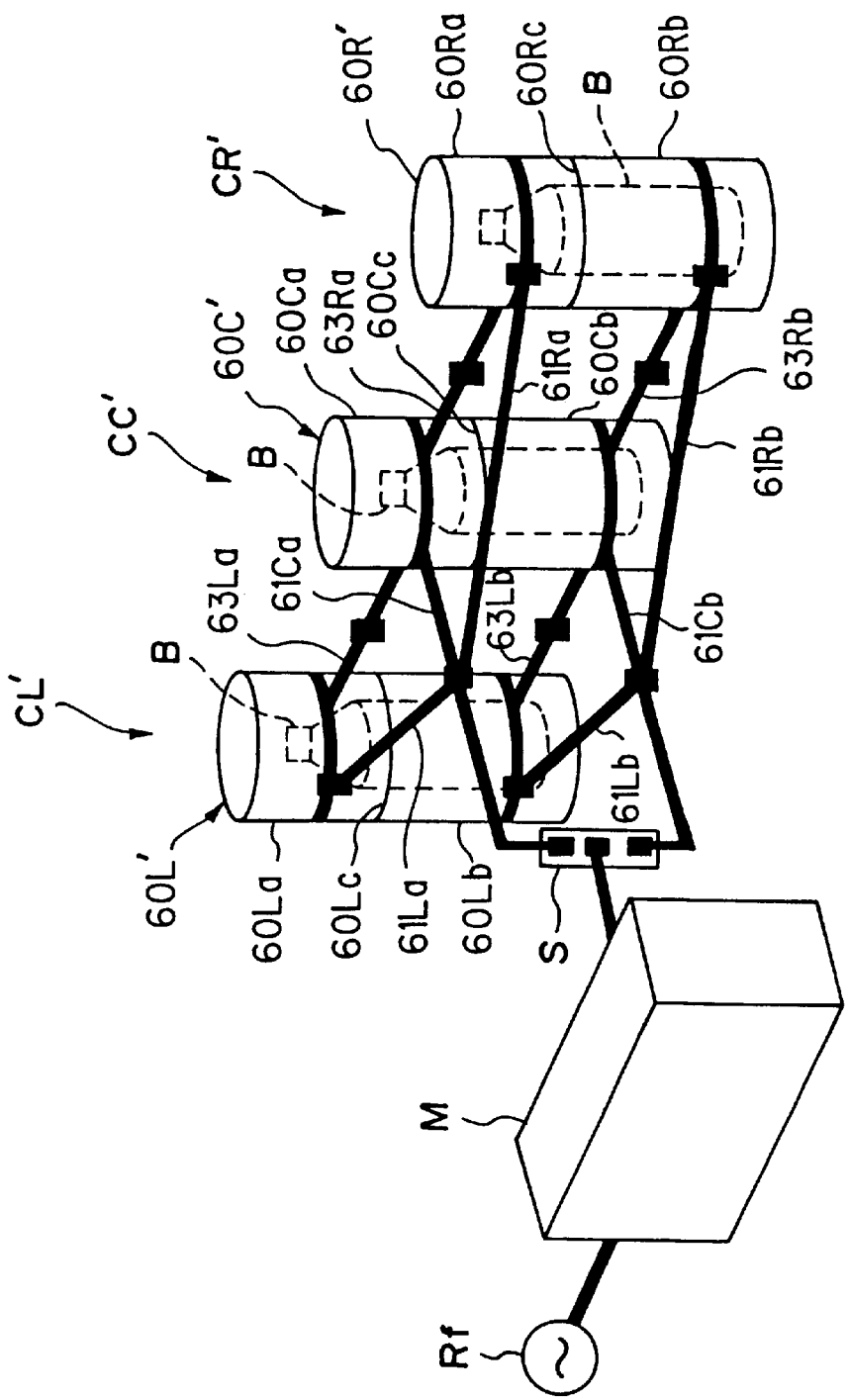
FIG. 15 is a schematic perspective view showing another embodiment of an apparatus for manufacturing a plastic container coated with a DLC film.

In FIG. 15, another embodiment of an apparatus for manufacturing the plastic container coated with the DLC film is shown.

As shown in the figure, in chambers CR', CC', and CL' of this apparatus, outer electrodes 60R', 60C' and 60L' is divided into upper parts 60Ra, 60C and 60La, and lower parts 60Rb, 60Cb and 60Lb by plane orthogonalized to the axes of the outer electrodes 60R', 60C' and 60L', respectively. Insulating plates 60Rc, 60Cc and 60Lc are attached between the upper parts 60Ra, 60C and 60La, and the lower parts 60Rb, 60Cb and 60Lb, respectively, so that the upper parts and the lower parts are insulated mutually.

A high frequency power source Rf and a matching box M are connected to the upper parts 60Ra, 60Ca and 60La of the outer electrodes 60R', 60C' and 60L' by using wires 61Ra, 61Ca and 61La via a selector switch S. A high frequency power source Rf and a matching box M are connected to the lower parts 60Rb, 60Cb and 60Lb of the outer electrodes 60R', 60C' and 60L' by using wires 61Rb, 61Cb and 61Lb via a selector switch S. By switching the selector switch S, electric power can be given to either the upper part of each chamber or the lower part of each chamber separately.

As mentioned above, the outer electrodes 60R', 60C' and 60L' are divided into the upper parts 60Ra, 60Ca and 60La, and the lower parts 60Rb, 60Cb and 60Lb in the vertical direction in order to be able to give electric power to the upper parts 60Ra, 60Ca and 60La, and the lower parts 60Rb, 60Cb and 60Lb of the outer electrodes 60R', 60C' and 60L' so that the DLC film can be formed uniformly in the whole of the plastic container. In the case where a gap between the outer electrode and the inner electrode in the area from the opening portion to the shoulder portion of the plastic container B is narrower than that in the area of the trunk portion of the plastic container B because of restriction of the shape of the plastic container B and the like, thickness of the DLC film formed in the area from the opening portion to the shoulder portion is different from that in the area of the trunk portion if electric power is given evenly to both the upper area and the lower area.

As is similar to the apparatus shown in FIG. 14, the upper part 60Ra of the outer electrode 60R' and the upper part 60Ca of the outer electrode 60C' are short-circuited with a wire 63Ra. The upper part 60Ca of the outer electrode 60C' and the upper part 60La of the outer electrode 60L' are short-circuited with a wire 63La. The lower part 60Rb of the outer electrode 60R' and the upper part 60Cb of the outer electrode 60C' are short-circuited with a wire 63Rb. The upper part 60Cb of the outer electrode 60C' and the upper part 60Lb of the outer electrode 60L' are short-circuited with a wire 63Lb.

By the above construction, when electric power is given to the upper parts 60Ra, 60Ca and 60La of the outer electrode 60R', 60C' and 60L' from the high frequency power source Rf via the matching box M and the selector switch S, electric power can be distributed almost evenly among the upper parts of the outer electrodes to form the DLC film in the area of the opening portion and the shoulder portion of the plastic container B received within the outer electrodes in the state where the condition of the DLC film is almost uniform in both the opening portion and the shoulder portion of the plastic container B. And furthermore, when electric power is given to the lower parts 60Rb, 60Cb and 60Lb of the outer electrodes 60R', 60C' and 60L' by switching the selector switch S, electric power is distributed almost evenly among the lower parts of the outer electrodes to form the DLC film in the trunk portion of the plastic container B in the state where the condition of the DLC film is almost uniform.

By adjusting strength of electric power or time for giving electric power which is given to the upper parts 60Ra, 60Ca and 60La, and the lower parts 60Rb, 60Cb and 60Lb of the outer electrodes 60R', 60C' and 60L', the DLC film can be formed uniformly in the whole of the plastic containers B.

In the apparatus shown in FIGS. 14 and 15, by shot-circuiting the chamber CR, CC and CL (CR', CC' and CL) with wires 63R and 63L (63Ra, 63Rb, 63La and 63Lb), condition for coating the DLC film in the chambers CR, CC and CL (CR', CC' and CL) can be brought to be close mutually in a state where condition of the all chambers is considered to be comparable mutually. However, when the chambers CR, CC and CL (CR', CC' and CL') is arranged in a line as shown in FIGS. 14 and 15, the chamber CC (CC') positioned at the center of the line is closer to power supply devices (the high frequency power source and the matching box M) than the other chambers CR, CL (CR', CL) positioned on both sides. Therefore, even if lengths of wires by which the matching box M is connected to these chambers CR, CC and CL (CR', CC' and CL) respectively are the same, electric power given to the middle chamber CC (CC' tends to be larger than that given to the other chambers because the middle chamber CC is closer to the power supply devices.

Accordingly, it is difficult to get condition for coating the DLC film in the chamber CR, CC and CL (CR', CC' and CL) completely the same.

Therefore, in an apparatus shown in FIG. 15, the chambers CR, CC and CL (CR', CC' and CL) are arranged in an arc around power supply devices (the high frequency power source and the matching box M) with the chambers CR, CC and CL (CR', CC' and CL') being positioned at the same distance from the power supply devices. Consequently, lengths of wires 61R (61Ra, 61Rb), 61C' (61Ca', 61Cb') and 61L (61La, 61Lb) can be the same. Therefore, condition for coating the DLC film in the chambers CR, CC and CL (CR', CC' and CL') can come to be closer mutually than the case where the apparatus shown in FIGS. 14 and 15 is used.

Figure 16:
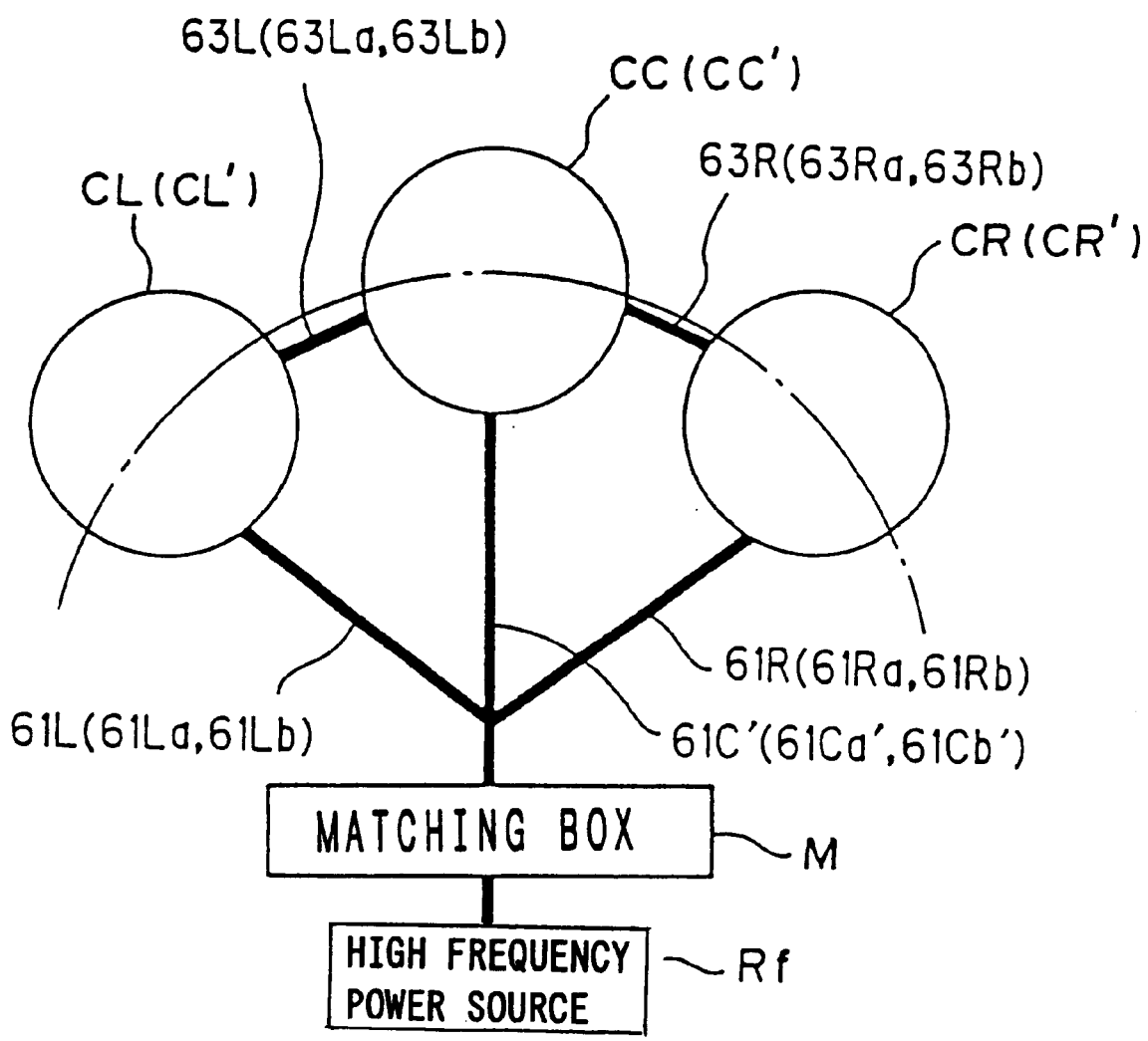
FIG. 16 is a schematic perspective view showing another embodiment of an apparatus for manufacturing a plastic container coated with a DLC film.

In an apparatus shown in FIGS. 17 to 20, which is gotten by improving on the apparatus shown in FIG. 16, plural chambers C are arranged in a circle at regular intervals.

As shown in FIGS. 17 to 20, each chamber C is attached with the body 60A of the outer electrode 60 suspended from a vacuum duct D made in the shape of a doughnut. These chambers C are arranged in a circle, as shown clearly in FIG. 20.

A table T which can be lifted up and taken down in the vertical direction by a lifting device (not shown in the figure) is arranged under the outer electrodes 60 attached to the vacuum duct D. On the table T, lids 60B of outer electrodes 60 are attached with the lid 60B of each outer electrode 60 facing the body 60 of the corresponding electrode 60.

The high frequency power source Rf and the matching box M are positioned in the center of the chambers C arranged in a circle. The high frequency power source Rf is connected to the body 60A of each electrode 60 via the matching box M by using each wire 61 which is extended in the radial direction from the center of the chambers C to the outside.

In the chambers C, the body 60A of each electrode 60 and the body 60A of the adjacent electrode 60 are short-circuited by using a wire 63.

Figure 17:
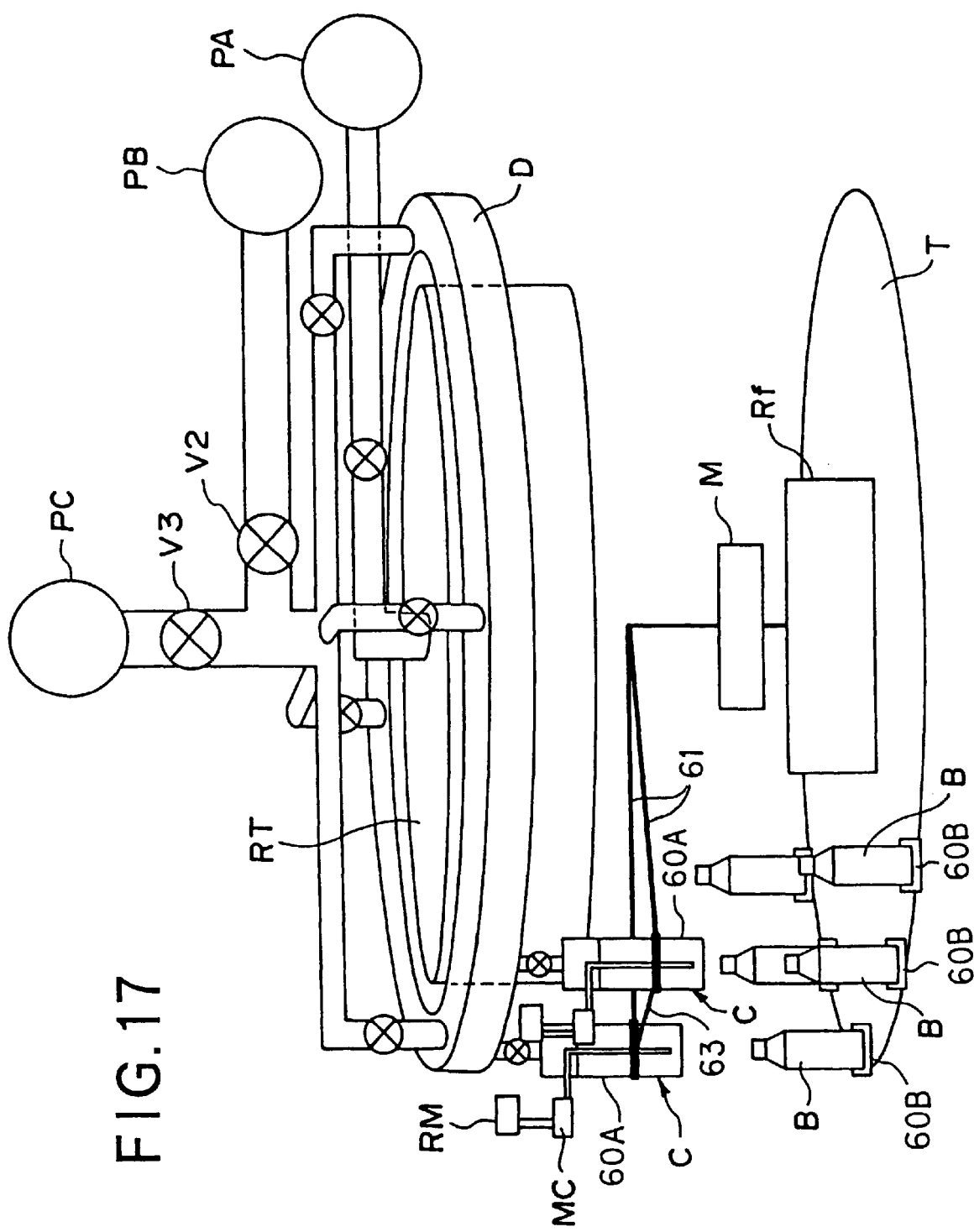
FIG. 17 is a perspective view showing another embodiment of an apparatus for manufacturing a plastic container coated with a DLC film with a vacuum device.
Figure 18:
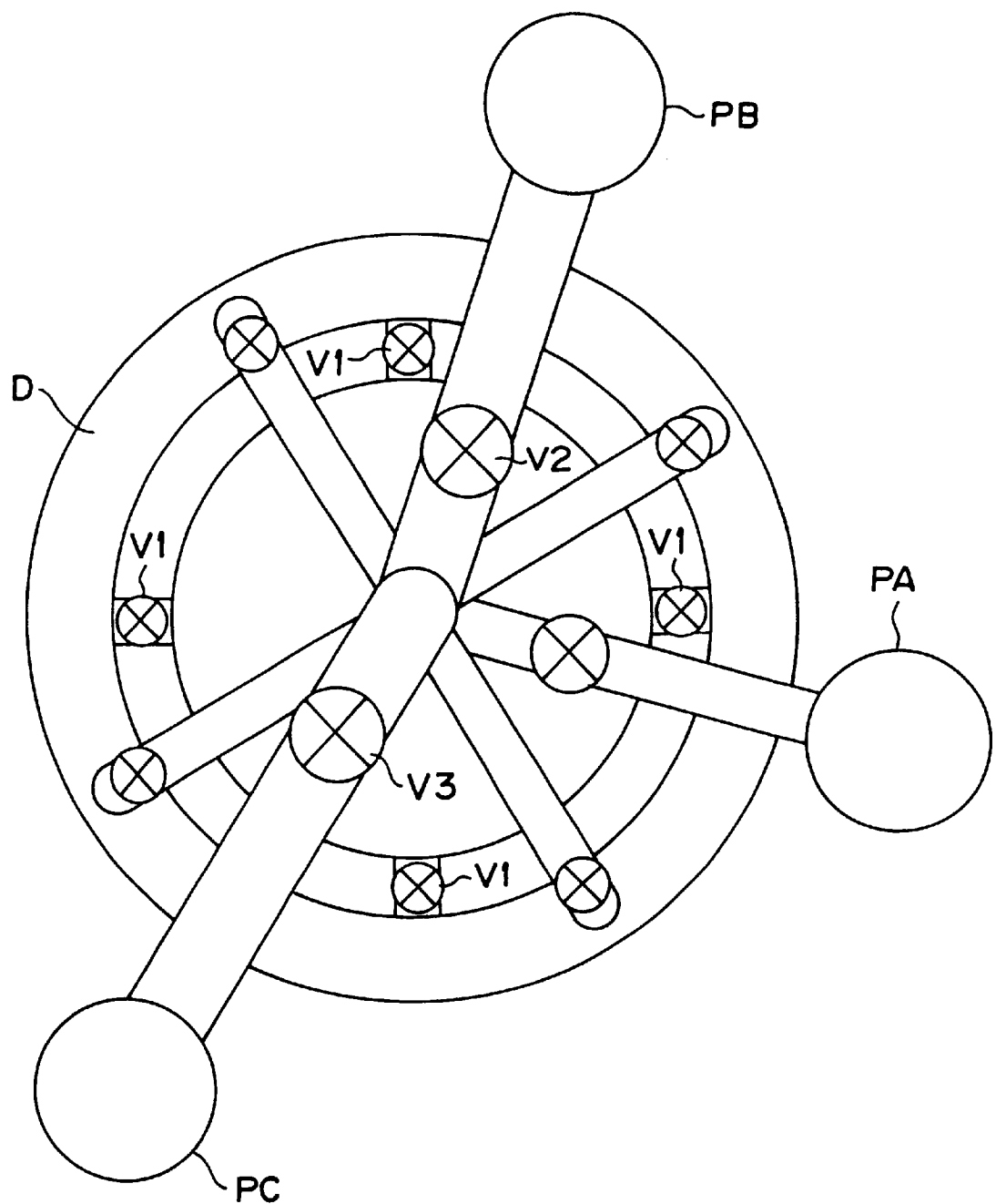
FIG. 18 is a plan view showing the vacuum device of the apparatus shown in FIG. 17.
Figure 19:
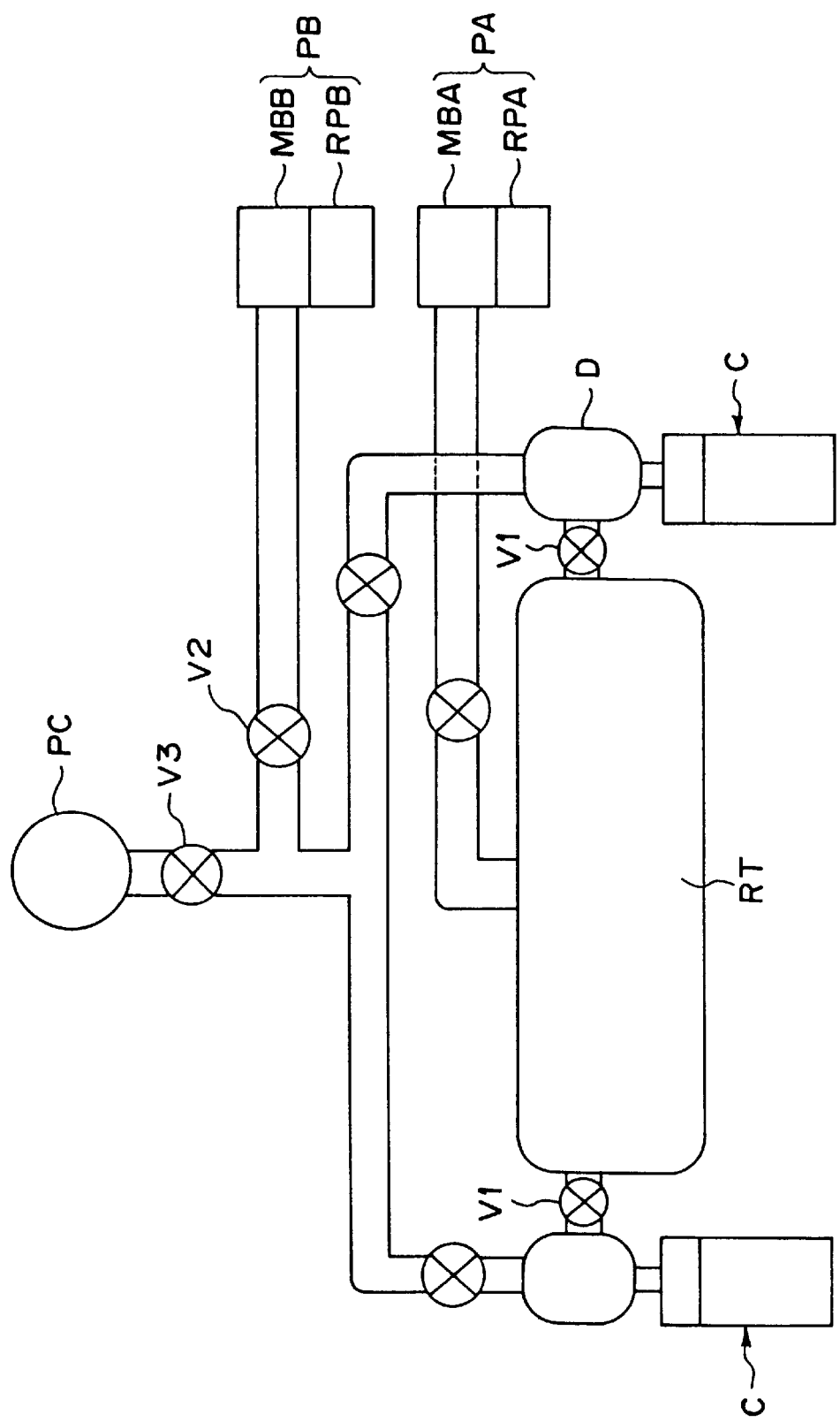
FIG. 19 is a side view showing the vacuum device of FIG. 17.
Figure 20:
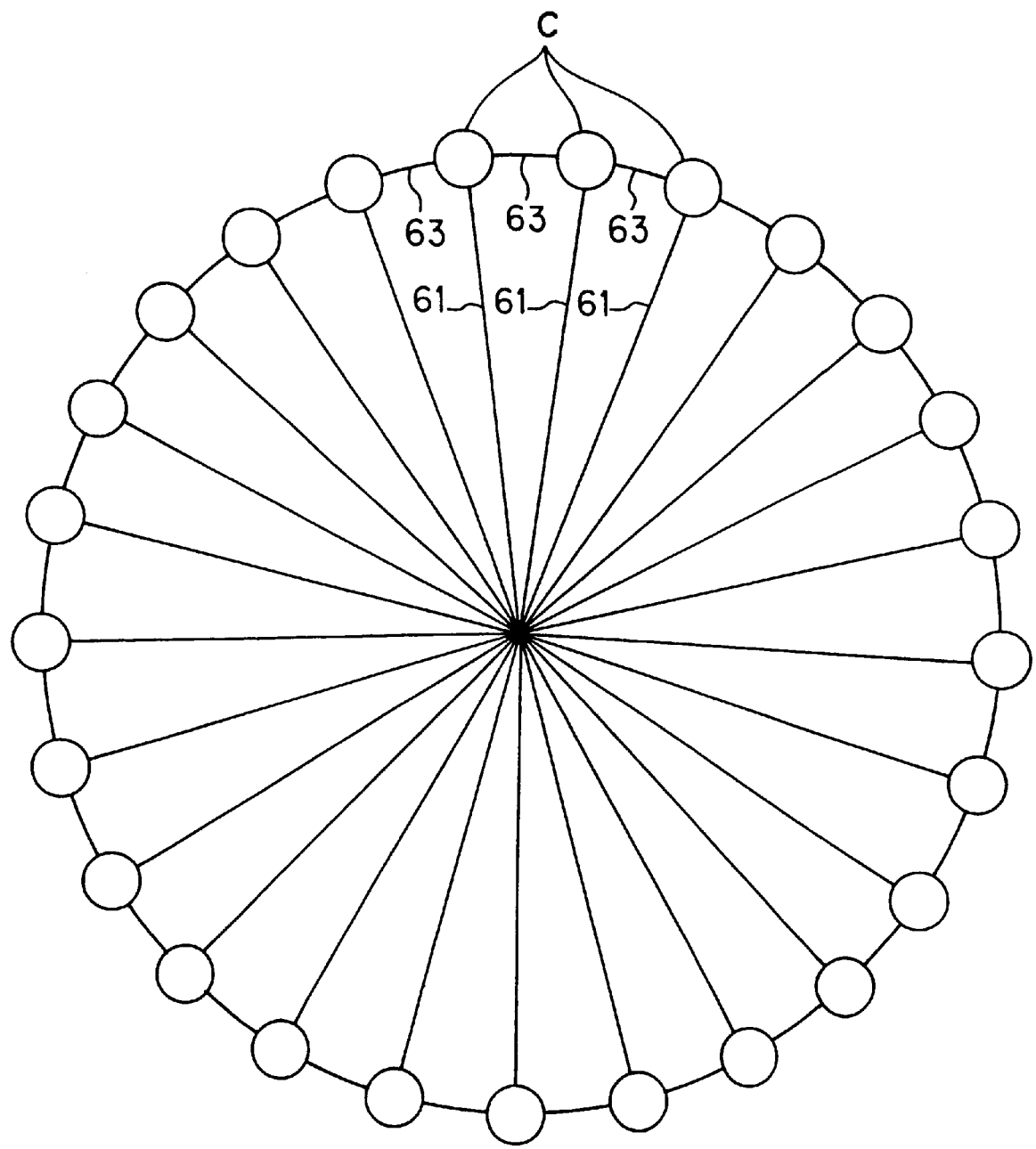
FIG. 20 is a plan view showing an arrangement of an outer electrode in the apparatus for manufacturing a plastic container coated with a DLC film shown in FIG. 17.

As indicated in FIGS. 17 to 19, a reserve tank RT is positioned in the center of the vacuum duct D. The reserve tank RT is connected to the vacuum duct D through four valves VI arranged in the periphery of the reserve tank RT at regular intervals. A vacuum pump PA is connected to the reserve tank RT, and the reserve tank RT can be evacuated by operating the vacuum pump PA.

The vacuum duct D is connected with a vacuum pump PB via a valve V2. The vacuum duct D is also connected with a cryopump PC via a valve V3. The chambers C can be evacuated step by step via the vacuum duct D by operating these pumps in turn.

Structure and operation of this vacuum device will be explained later.

In the apparatus shown in FIGS. 17 to 20, the plastic container B which should be coated with the DLC film is put on each lid 60B attached on the table T set in a lower position, in an upright stance. After that, the plastic container B is received within the body 60A of the electrode 60 corresponding to the lid on which the plastic container B is put.

After the valves V1, V2 and V3 are opened and shut in turn, and the reserve tank RT, the vacuum tank PB and the cryopump PC are operated so that each chamber is evacuated by exhausting via the vacuum D, carbon source gas is supplied from a gas supplying device RM into the plastic container B received within each chamber C, via a mass flow controller MC.

After that, electric power is supplied to the outer electrode 60 of each chamber C via the matching box M by the high frequency power source Rf. Accordingly, since plasma is generated between each outer electrode 60 and the inner electrode inserted into this outer electrode 60, the DLC film is formed on the inner surface of the plastic container B. This process of forming the DLC film by plasma is comparable to that in the case where the apparatus shown in FIG. 25 is used.

In this embodiment of the apparatus, the chambers C are positioned at the same distance from the high frequency power source Rf with length of the wires 61 being the same mutually. And further, each chamber C is sequentially connected to the adjacent chambers C on both sides in the same condition, although the chambers CR and CL ( CR' and CL') positioned on both sides are connected only to the central chamber CC, on the other hand the central chamber CC (CC') is connected to the two chambers CR and CL ( CR' and CL', in the apparatuses shown in FIGS. 14 to 16. Therefore, condition of the chambers, in which the DLC film is coated, can be make more completely the same in this embodiment. Consequently, the DLC films of the plastic container coated in the chambers C comes to be more even mutually.

Figure 21:
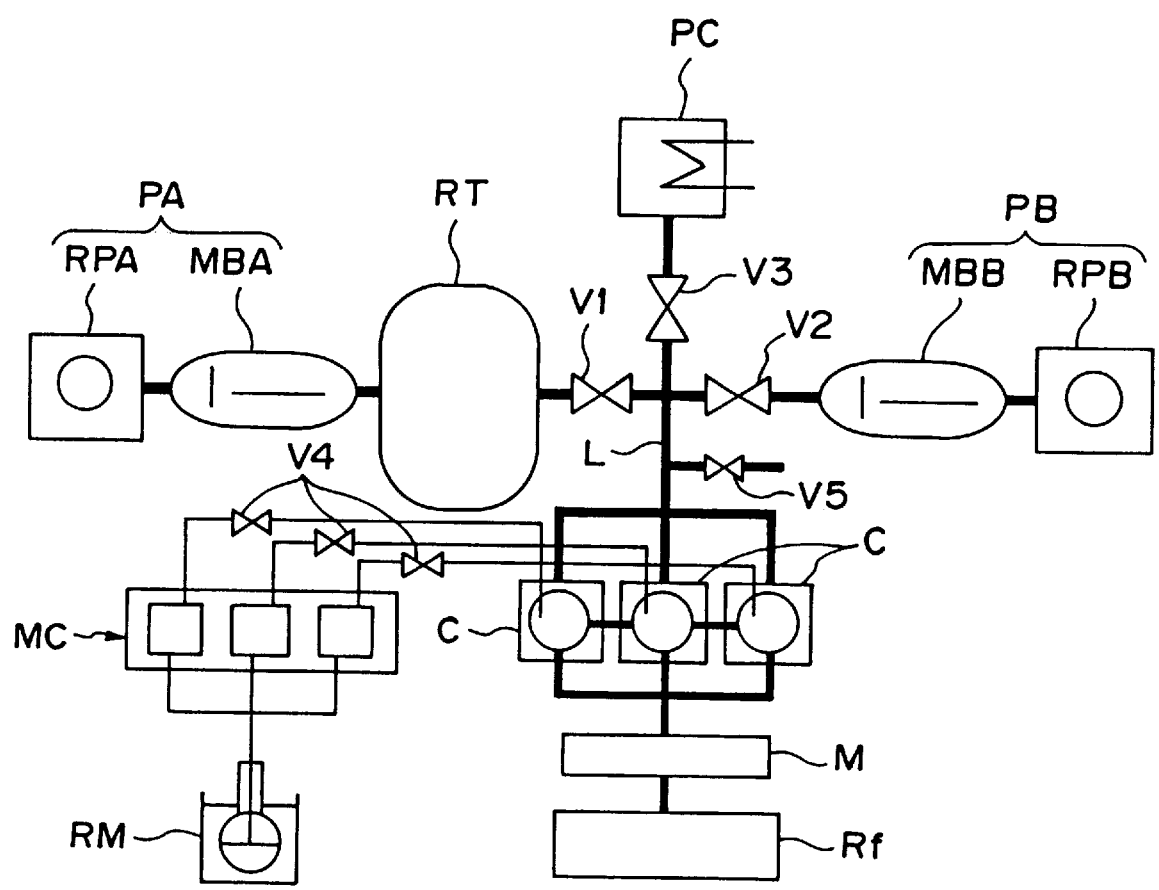
FIG. 21 is a view showing a circuit of the vacuum device shown in FIG. 17.

FIG. 21 is a piping diagram showing an outline of the structure of the vacuum device connected to the apparatuses shown in FIGS. 14 to 20.

As shown in FIG. 21, the reserve tank RT is connected with an inlet pipe L connected to the chamber C via the valve V1. The reserve tank RT is also connected with the cryopump PC via the valve V3. The vacuum pump PA is connected to the reserve tank RT.

The vacuum pump PA is composed of a mechanical booster pump MBA and a rotary pump RPA. The vacuum pump PB is composed of a mechanical booster pump MBB and a rotary pump RPB. The mechanical booster pumps MBA and MBB are provided for assisting the rotary pumps RPA and RPB, respectively.

The gas supply device RM and the mass flow controller MC are connected to each chamber C via each valve V4. The high frequency power source Rf is also connected to each chamber C via the matching box M. In FIG. 21, the valve V5 is a release valve which is connected to the inlet pipe L to leaking gas from the chamber C.

When the apparatus shown in FIG. 21 is connected to the apparatus shown in FIGS. 17 to 20, the vacuum duct D in FIG. 21 corresponds to the inlet pipe L in FIG. 21.

Figure 22:
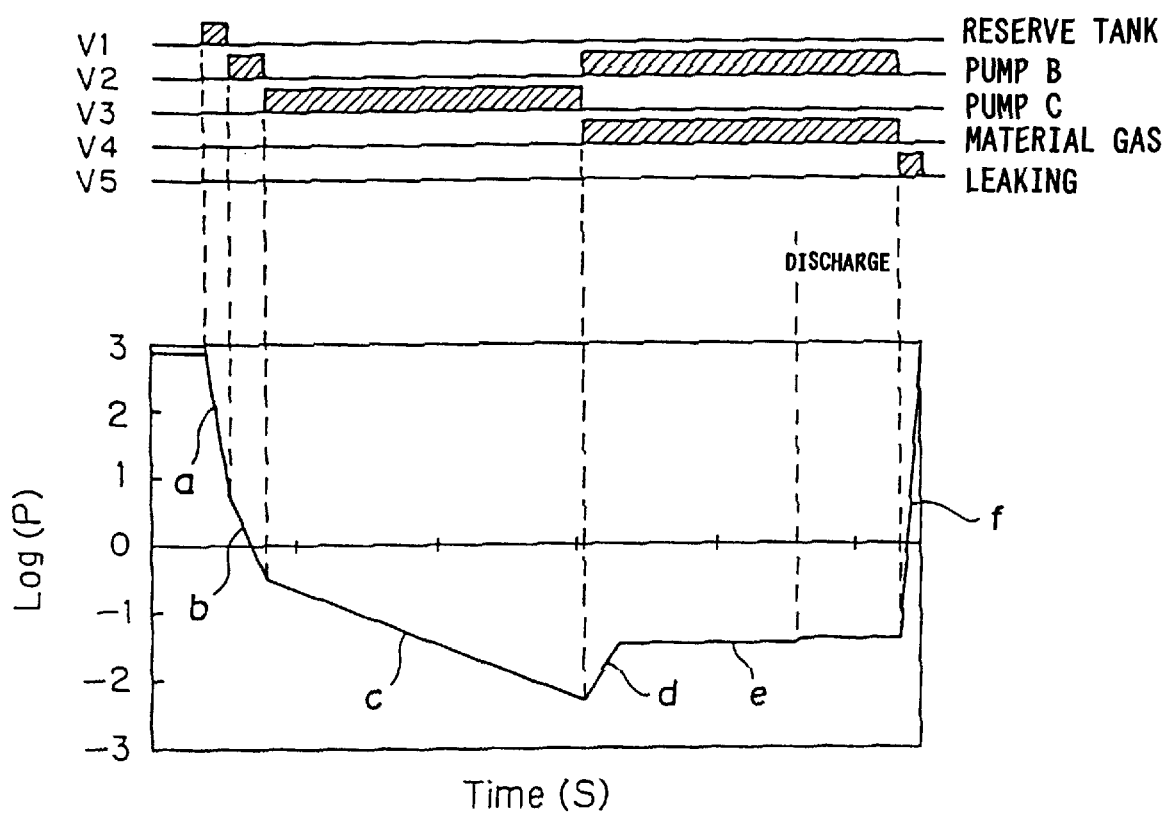
FIG. 22 is a view showing change of pressure in a chamber when the vacuum device shown in FIG. 17 is operated.

In FIG. 22, an operation cycle of the above vacuum device and change of pressure in the chambers C corresponding to the operation cycle are shown.

The following is an explanation of the operation of the vacuum device shown in FIG. 21.

Controlling of opening and shutting the valves and controlling operation of the pumps can be carried out by using a controller such as a sequential controller or microcomputer.

The reserve tank RT is evacuated by operating the vacuum pump PA and degree of vacuum in the reserve tank RT is kept constant so as to be a predetermined value before the chamber C is evacuated by the vacuum device.

After the plastic container B is received within each chamber C and the chamber C is shut tight, air in the chamber C is discharged into the reserve tank RT and pressure in the chamber C is reduced in quick motion ("a" in FIG. 22).

After pressure in each chamber C is reduced to a predetermined value by exhausting via the reserve tank RT, the valve V1 is shut. After that, pressure in the chamber C is additionally reduced by exhausting the reserve tank RT in accordance with operating of the vacuum pump PB when the valve V2 is opened ("c" in FIG. 22).

After the valve V1 is shut, air in the reserve tank RT is discharged by operating the vacuum pump PA so that degree of vacuum in the reserve tank RT is returned to the predetermined value for preparing the next coating of the DLC film. In this process, when pressure in the reserve tank RT is reduced to a certain extent, the mechanical booster pump MBA starts its operation so as to reduce pressure in the reserve tank RT to a predetermined value in quick motion.

In the vacuum pump PB, as in the vacuum pump PA, when pressure in the chamber C is reduced to a certain extend by the rotary pump RPB, the mechanical booster pump MBB starts its operation so as to reduce pressure in the reserve tank RT to a predetermined value in quick motion.

After pressure in each chamber C is reduced to a predetermined value by exhausting of the vacuum pump PB, the valve V2 is shut. After that, the valve V3 is opened and pressure in the chamber C is additionally reduced by adsorption of gas caused by operating the cryopump PC when the valve V3 is opened ("C" in FIG. 22).

In the cryopump PC, molecule of gas staying behind is frozen and absorbed by a refrigerator system using gaseous helium in order to get high degree of vacuum.

When pressure in each chamber C is reduced to a predetermined value by the cryopump PC, the valve V3 is shut.

After that, when the valve V2 is again opened and the valve V4 is opened, material gas as a carbon source supplied from the gas supplying device RM via the mass flow controller MC is introduced into the chamber C through suction of the vacuum pump PB.

At this time, pressure in the chamber C is slightly raised by introducing material gas into the chamber C ("d" in FIG. 22). After that, pressure in the chamber C is kept constant in a predetermined value by operating the vacuum pump PB ("e" in FIG. 22).

After a predetermined volume of material gas is introduced into the chamber C in the above way, electric power is given to each outer electrode 60 from the high frequency power source Rf via the matching box M to generate plasma. Accordingly, the DLC film coating the plastic container B is formed.

After supplying electric power to the outer electrode 60 from the high frequency power source Rf in a predetermined period, the valve V5 is opened to discharge gas out of the chamber C ("f" in FIG. 22).

After that, the plastic container B is exchanged and the above process for forming the DLC film in the next plastic container is carried out. In this way, the plastic container coated with the DLC film can be mass-produced.

In the above apparatus, since the plural pumps having properties different each other are operated in turn after pressure in the chamber is reduced in quick motion to equilibrium pressure by using the reserve tank in which high degree of vacuum has been gotten in advance. Therefore, each pump gives full play to it's ability within the limit of pressure suitable for each pump, and high degree of vacuum can be gotten in a short period. Consequently, the manufacturing efficiency can be improved when the plastic container coated with the DLC film is mass-produced.

Figure 23:
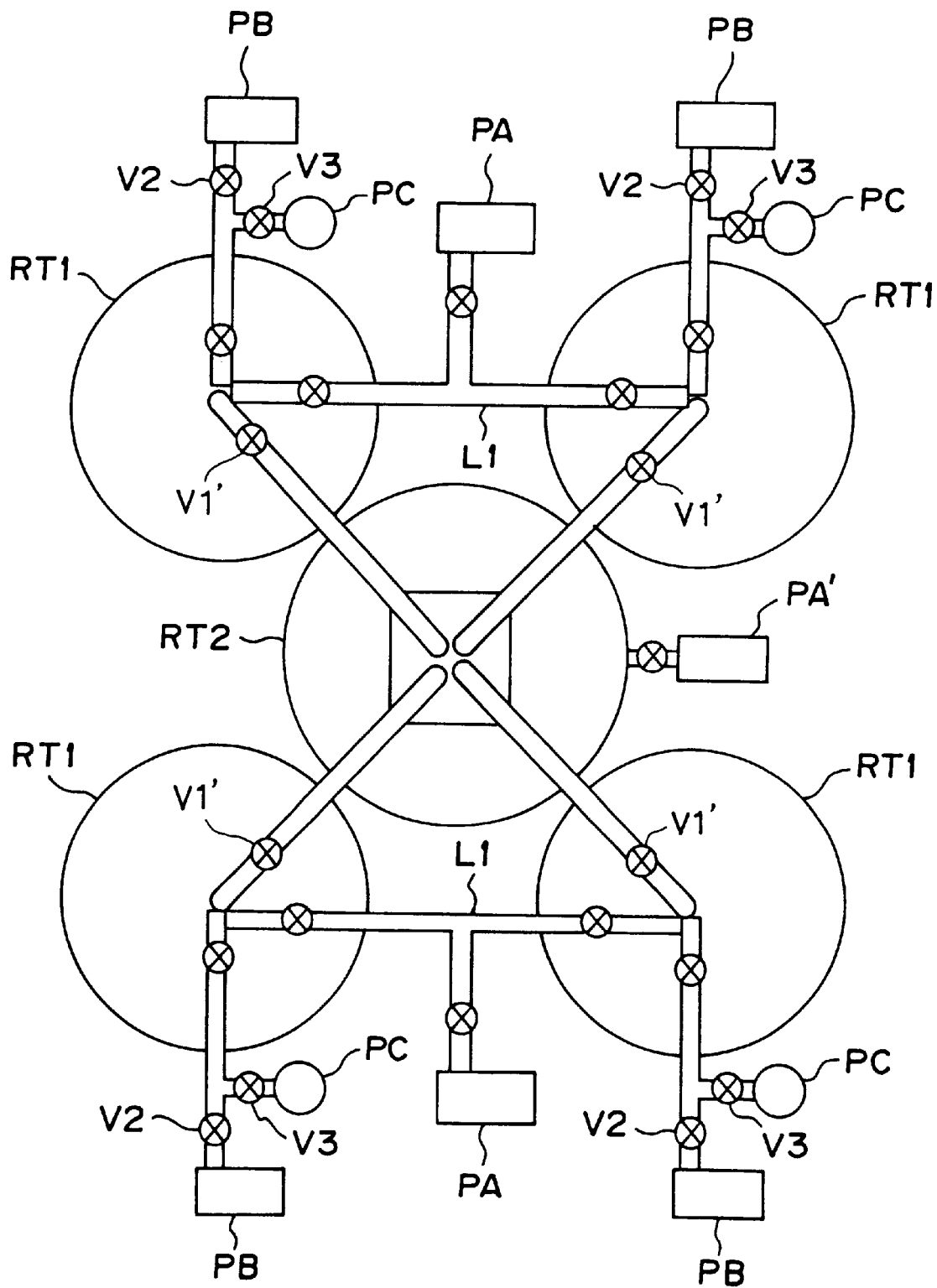
FIG. 23 is a plan view showing a vacuum device in another apparatus for manufacturing a plastic container coated with a DLC film.

In FIG. 23, an embodiment of an apparatus for manufacturing the plastic container coated with the DLC film is shown. In the apparatus, the plural apparatuses shown in FIG. 17 (four apparatuses is shown in the figure) are connected mutually so that the DLC film can be formed in a lot of the plastic containers at the same time.

In the apparatus, the plural apparatuses (four apparatuses is shown in the figure) shown in FIG. 17 are provided and these apparatuses are connected mutually.

As shown in FIG. 23, the reserve tanks shown in FIG. 17 are positioned in four directions. The reserve tank is represented by "the first reserve tank RT1" in the following explanation. In the center of the first reserve tanks RT1, a second reserve tank RT2 is arranged. By these two reserve tanks RT1 and RT2, chambers (not shown in the figure) arranged in a circle around the first reserve tank RT1 can be evacuated at high speed.

Figure 24:
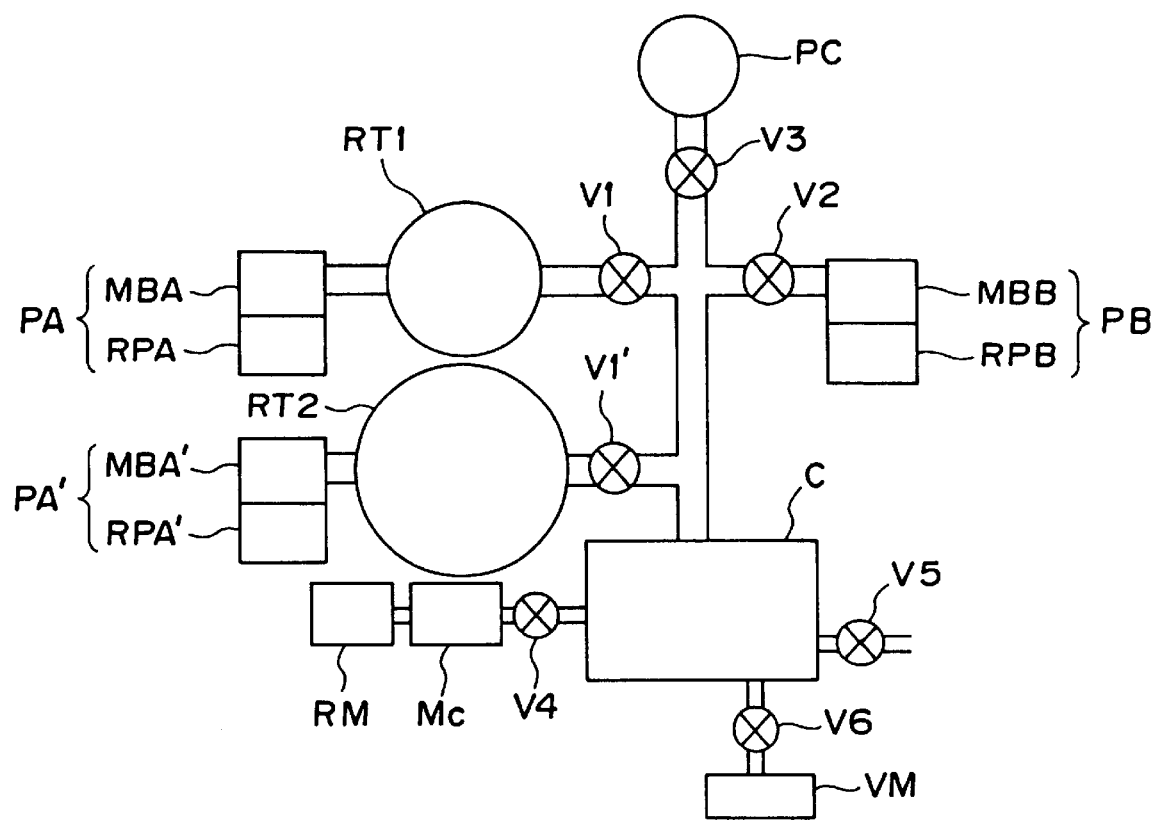
FIG. 24 is a view showing a circuit in the apparatus shown in FIG. 23.

As shown in FIG. 24, the chambers C (only one chamber C is shown in the figure) are arranged in a circle around each of the first reserve tanks RT1. As in the apparatus shown in FIG. 21, each chamber C is connected with the first reserve tank RT1, a vacuum pump PB and a cryopump PC, via a valve V1, a valve V2 and a valve V3, respectively.

The second RT2 is connected to each chamber C via a valve V1'.

In FIG. 24, "VM" represents a vacuum gage connected to each chamber C via a valve V6. The other element corresponding to that of the apparatus shown in FIG. 21 is represented by the same reference numeral or symbol which represents the corresponding element.

As shown in FIG. 23, a vacuum pump PA is connected to a pair of the first reserve tanks RT1 which are positioned adjacent mutually via a exhaust pipe L1. These tanks RT1 are evacuated by the vacuum pump PA. A vacuum pump PA' is connected to the second reserve tank RT2. The second tank RT2 is evacuated by the vacuum pump PA'.

In this vacuum device, the chambers arranged in a circle around each of the first reserve tanks RTI1 are evacuated until predetermined degree of vacuum is gotten, by operating the first reserve tank RT1, the second reserve tank RT2, the vacuum pump PB and the cryopump PC in that order.

In other wards, the first reserve tank RT1 and the second reserve tank RT2 are evacuated by operating the vacuum pumps PA and PA' so that predetermined degree of vacuum is kept in the reserve tanks RT1 and RT2 before exhausting of the chambers C is begun.

When each chamber C is shut tightly with the plastic container B is received in the chamber C, air in the chamber C is discharged into the first reserve tank RT1. And, pressure in the chamber C is reduced in quick motion until it is balanced with pressure in the first reserve tank RT1.

After the valve V1 is shut, the chamber C is evacuated by the second reserve tank RT2 when the valve V' is opened. Accordingly, pressure in each chamber C is additionally reduce until pressure in each chamber C is balanced with that in the second reserve tank RT2.

And then, after the valve V1' is shut, the valve V2 is opened. The chamber C is evacuated again so that pressure in the chamber C is additionally reduced.

After the valve V1 is shut, air in the first reserve tanks RT1 is discharged by operating the vacuum pump PA so that degree of vacuum in the first reserve tank RT1 returns to a predetermined value for the next process for forming the DLC film. After the valve V1' is shut, air in the second reserve tank RT2 is discharged by operating the vacuum pump PA' so that degree of vacuum in the second reserve tank RT2 returns to a predetermined value for the next process for forming the DLC film.

When pressure in each chamber C is reduced to a predetermined value by operating the vacuum pump PB, the valve V2 is shut. Next, the valve V3 is opened and pressure in the chamber C is additionally reduced by freezing and adsorption of gas through the operation of the cryopump PC.

When pressure in each chamber C reaches a predetermined value in which plasma discharge can occur, by operating the cryopump PC, the valve V3 is shut. After that, the valve V2 is again opened and the valve V4 is opened. Consequently, material gas as a carbon source supplied from the gas supplying device RM via the mass flow controller MC is introduced into the chamber C through suction of the vacuum pump PB.

And then, plasma discharge occurs in each chamber C and the DLC film is coated on the surface of the plastic container received within the chamber C. After plasma discharge in a predetermined period, a valve V5 is opened so that air is discharged out of the chamber C.

And further, after exchanging the plastic container received within the chamber C, a series of the above processes is repeated. In this way, the plastic container B coated with the DLC film is mass-produced.

The apparatus shown in FIGS. 23 and 24 is provided with the first reserve tanks RT1 each of which is prepared for a circle of the chambers C. The apparatus is also provided with the second reserve tank RT2 having large volume. And furthermore, exhausting of the chambers C by these reserve tanks proceeds step by step. Accordingly, pressure in the chamber C can be reduced in quick motion and time for exhausting can be shortened extremely.

As mentioned above, the apparatus and the method for manufacturing the plastic container coated with the DLC film are available to manufacturing a returnable plastic container in which the DLC film is formed on the inner surface of the container in state where thickness of the DLC film is even in the whole of the container. The apparatus and the method for manufacturing the plastic container coated with the DLC film are also available to mass-producing the plastic container in which the DLC film is formed on the inner surface of the container in state where thickness of the DLC film is in the whole of the container.

What is claimed is:

1. An apparatus for manufacturing a plastic container coated with a diamond-like carbon film, comprising:

an outer electrode having a chamber with a shape comparable to an outline of the plastic container, the plastic container being received in the chamber, and an inner surface of the chamber of the outer electrode having a shape in which the plastic container having a protrusion can be received within the chamber;

an inner electrode inserted into the plastic container which is received within the chamber of the outer electrode; and an attaching member having an inner surface with a shape comparable to the outline of the plastic container, the attaching member covering an area where the protrusion is formed when the attaching member is attached to the plastic container, the attaching member configured to be received within the chamber of the outer electrode in company with the plastic container in a state where the attaching member is attached to the plastic container, the attaching member being electrically conductive, wherein the diamond-like carbon film if formed on an inner surface of the plastic container received in the chamber by generating plasma between the outer electrode and the inner electrode after the chamber is evacuated and gas as a carbon source is supplied into the chamber, and wherein the attaching member is set in a space formed between the inner surface of the chamber of the outer electrode and an outer surface of the plastic container received in the chamber.

2. An apparatus for manufacturing a plastic container coated with a diamond-like carbon film according to claim 1, wherein the attaching member is attached to the container in which the protrusion projects in the radial direction from the outer surface of the plastic container with the attaching member covering an outer surface of the plastic container in an area where the protrusion is formed, and wherein the attaching member is supported in a state where an outer surface of the attaching member substantially touches the inner surface of the chamber when the attaching member is received in the chamber of the outer electrode with the attaching member attached to the plastic container.

3. An apparatus for manufacturing a plastic container coated with a diamond-like carbon film according to claim 2, wherein the attaching member is composed of an upper part and a lower part, wherein a flange as the protrusion projects in the radial direction from the outer surface of the plastic container in an area of an opening portion of the plastic container, wherein the upper part of the attaching member is attached to the outer surface of the plastic container in an area above the flange, and the lower part of the attaching member is attached to the outer surface of the plastic container in an area under the flange, wherein an outside diameter of the upper part of the attaching member is comparable to an outside diameter of the flange, and an outside diameter of the lower part of the attaching member is comparable to the outside diameter of the flange, and wherein an outer surface of the upper part and an outer surface of the lower part are substantially flush with an peripheral surface of the flange in an area near to the flange.

4. An apparatus for manufacturing a plastic container coated with a diamond-like carbon film according to claim 1, wherein an inner surface of the attaching member comprises a shape similar to the outer surface of the container which has the protrusion projecting in the radial direction from the outer surface of the plastic container, and wherein the attaching member is received within the chamber of the outer electrode in company with the plastic container in a state where the plastic container is received within the attaching member.

5. An apparatus for manufacturing a plastic container coated with a diamond-like carbon film according to claim 1, further comprising:

a view port configured to monitor an inside of the outer electrode via heat resisting glass attached to the outer electrode.

6. An apparatus for manufacturing a plastic container coasted with a diamond-like carbon film comprising:

an outer electrode having a chamber with a shape comparable to an outline of the plastic container, the plastic container being received in the chamber; and an inner electrode inserted into the plastic container which is received within the chamber of the outer electrode, wherein the outer electrode is divided into plural parts, wherein the chamber includes parts of the outer electrode assembled mutually with parts of the outer electrode insulated by a insulating member, and wherein a high frequency power source is connected to each of the plural parts of the outer electrode so that electric power can be given to each of the plural parts of the outer electrode separately.

7. An apparatus for manufacturing a plastic container coated with a diamond-like carbon film according to claim 6, wherein the outer electrode is divided into two parts as the plural parts of the outer electrode, and wherein a trunk portion of a bottle as the plastic container is received within one of the two parts, and a shoulder portion and an opening portion of the bottle are received within the other part of the outer electrode.

8. An apparatus for manufacturing a plastic container coated with a diamond-like carbon film according to claim 6, further comprising:

an attaching member having an inner surface with a shape comparable to the outline of the plastic container, the plastic container having a protrusion which projects in the radial direction from an outer surface of the plastic container, the attaching member covering an area where the protrusion is formed when the attaching member is attached to the plastic container, the attaching member configured to be received within the chamber of the outer electrode in company with the plastic container in a state where the attaching member is attached to the plastic container, the attaching member being electrically conductive, wherein an inner surface of the chamber including the plural parts of the outer electrode comprises a shape in which the plastic container having the protrusion can be received within the chamber, and wherein the attaching member is set in a space formed between the inner surface of the chamber of the outer electrode and the outer surface of the plastic container received within the chamber, and the space is formed because of receiving the protrusion in the chamber.

9. An apparatus for manufacturing a plastic container coated with a diamond-like carbon film according to claim 6, further comprising:

high frequency power sources, a number of the power sources being the same with a number of the plural parts of the outer electrode, each of the power sources being connected to a corresponding one of the plural parts of the outer electrode.

10. An apparatus for manufacturing a plastic container coated with a diamond-like carbon film according to claim 6, further comprising:

high frequency power sources, the power sources being connected to each of the plural parts of the outer electrode via a selector switch.

11. An apparatus for manufacturing a plastic container coated with a diamond-like carbon film according to claim 6, further comprising:

a view port configured to monitor an inside of the outer electrode via heat resisting glass attached to the outer electrode.

12. A method for manufacturing a plastic container coated with a diamond-like carbon film, comprising the steps of:

inserting the plastic container into a chamber having a shape comparable to an outline of the plastic container, the chamber being formed in an outer electrode;

inserting an inner electrode into the plastic container received in the chamber;

evacuating the chamber and supplying gas as a carbon source into the chamber; and generating plasma between the outer electrode and the inner electrode so that the diamond-like carbon film is formed on an inner surface of the plastic container, wherein an attaching member is attached to an outer surface of the plastic container having a protrusion which projects in a radial direction from an outer surface of the plastic container, and an inner surface of the attaching member is formed in the shape comparable to the outer surface of the plastic container, wherein the outer electrode is formed so that the plastic container having the protrusion can be received within the outer electrode, and the outer surface of the plastic container in an area of the protrusion is covered with the outer electrode, wherein the attaching member is set in a space formed between an inner surface of the chamber of the outer electrode and the outer surface of the plastic container when the plastic container to which the attaching member is attached is received within the chamber of the outer electrode in company with the attaching member, and the attaching member is electrically conductive, and wherein the space is formed because of receiving the plastic container having the protrusion within the chamber.

13. A method for manufacturing a plastic container coated with a diamond-carbon film according to claim 12, wherein the attaching member is attached to the outer surface of the plastic container in an area of the protrusion in a state where the area of the protrusion is covered, wherein the attaching member attached to the plastic container is received within the chamber of the outer electrode in company with the plastic container, wherein the attaching member is set in a space formed between the inner surface of the chamber and the outer surface of the plastic container, and wherein the space is formed because of receiving the plastic container having the protrusion within the chamber.

14. A method for manufacturing a plastic container coated with a diamond-like carbon film according to claim 12, wherein the outer surface of the plastic container is covered with the attaching member within which the plastic container is received, wherein the attaching member, within which the plastic container is received, is received within the chamber of the outer electrode, and wherein the chamber is formed in a shape comparable to an outer surface of the attaching member.

15. A method for manufacturing a plastic container coated with a diamond-carbon film, comprising the steps of:

inserting the plastic container into a chamber having a shape comparable to an outline of the plastic container, the chamber being formed in an outer electrode;

inserting an inner electrode into the plastic container received in the chamber;

evacuating the chamber and supplying gas as a carbon source into the chamber; and generating plasma between the outer electrode and the inner electrode so that the diamond-carbon film is formed on an inner surface of the plastic container, wherein the outer electrode is divided into plural parts, and the plural parts are assembled into the outer electrode in which the chamber is formed in a state where the plural parts are mutually insulated by an insulating member, and wherein a high frequency power source system is connected to each of the plural parts of the outer electrode so that electric power is given to each of the plural parts of the outer electrode separately.

16. A method for manufacturing a plastic container coated with a diamond-like carbon film according to claim 15, wherein the high frequency power source system includes plural high frequency power sources, a number of which is the same as a number of the plural parts of the outer electrode, and each of the high frequency power sources is connected to a corresponding part of the outer electrode.

17. A method for manufacturing a plastic container coated with a diamond-like carbon film according to claim 15, wherein the high frequency power source system includes a high frequency power source connected to each part of the outer electrode via a selector switch.

18. An apparatus for manufacturing a plastic container coated with a diamond-like carbon film, comprising:

plural outer electrodes in each of which a chamber is formed, the plastic container being received in the chamber; and inner electrodes each of which is inserted into the plastic container received within the chamber of each of the plural outer electrodes, wherein the diamond-like carbon film is formed on an inner surface of the plastic container by generating plasma between the plural outer electrodes and the plural inner electrodes when electric power is given to the plural outer electrodes by a high frequency power source after the chamber is evacuated and gas as a carbon source is supplied into the chamber, and wherein the high frequency power source is connected to each of the plural outer electrodes, and the plural outer electrodes are mutually connected by a wire.

19. An apparatus for manufacturing a plastic container coated with a diamond-like carbon film according to claim 18, wherein each of the plural outer electrodes is divided into plural parts, and the plural parts are assembled into the chamber with the plural parts being mutually insulated by an insulating member, wherein the high frequency power source is connected to each part of the plural outer electrodes, and wherein corresponding parts of respective electrodes are connected to each other by a wire.

20. An apparatus for manufacturing a plastic container coated with a diamond-like carbon film according to claim 19, wherein the plural outer electrodes are arranged in a circular arc, and wherein the high frequency power source is connected to each of the plural outer electrodes by wires extended in a straight line from a center of the circular arc of the electrodes, and each of the plural outer electrodes is connected to an adjacent outer electrode by a wire.

21. An apparatus for manufacturing a plastic container coated with a diamond-carbon film according to claim 19,
wherein the plural outer electrodes are arranged in a circle, and
wherein the high frequency power source is connected to each of the plural outer electrodes by wires extended in a straight line from a center of the circle of the electrodes, and each of the plural outer electrodes is connected to an adjacent outer electrode by a wire.

22. An apparatus for manufacturing a plastic container coated with a diamond-like carbon film according to claim 18,
wherein the plural outer electrodes are arranged in a circular arc, and
wherein the high frequency power source is connected to each of the plural outer electrodes by wires extended in a straight line from a center of the circular arc of the plural outer electrodes, and each of the plural outer electrodes is connected to an adjacent outer electrode by a wire.

23. An apparatus for manufacturing a plastic container coated with a diamond-carbon film according to claim 18,
wherein the plural outer electrodes are arranged in a circle, and
wherein the high frequency power source is connected to each of the plural outer electrodes by wires extended in a straight line from a center of the circle of the electrodes, and each of the plural outer electrodes is connected to an adjacent outer electrode by a wire.

24. An apparatus for manufacturing a plastic container coated with a diamond-like carbon film, comprising:
an outer electrode in which a chamber is formed, the plastic container being received in the chamber; and
an inner electrode inserted into the plastic container received within the chamber of the outer electrode,
wherein the diamond-like carbon film is formed on an inner surface of the plastic container by generating plasma between the outer electrode and the inner electrode when electric power is given to the outer electrode by a high frequency power source after the chamber is evacuated and gas as a carbon source is supplied into the chamber,
wherein the apparatus is provided with a reserve tank connected to the chamber via a valve and plural vacuum pump systems connected to the chamber via plural valves, respectively, and
wherein the chamber is evacuated by using the reserve tank and the plural vacuum pumps systems step by step when a corresponding valve is opened in turn.

25. An apparatus for manufacturing a plastic container coated with a diamond-like carbon film according to claim 24,
wherein one of the plural vacuum pump systems includes a mechanical booster pump and a rotary pump.

26. An apparatus for manufacturing a plastic container coated with a diamond-like carbon film according to claim 24,
wherein one of the pump systems includes a cryopump.

27. An apparatus for manufacturing a plastic container coated with a diamond-like carbon film, comprising:
plural outer electrodes, in each of which a chamber is formed, the plastic container being received in the chamber;
inner electrodes each of which is inserted into the plastic container received within the chamber of each of the plural outer electrodes;
plural individual reserve tanks connected to the chambers via a valve;
a common reserve tank connected to the chambers via a valve; and
plural vacuum pump systems,
wherein the diamond-like carbon film is formed on an inner surface of the plastic container by generating plasma between the plural outer electrodes and the inner electrode when electric power is given to the plural outer electrodes by a high frequency power source after the chamber is evacuated and gas as a carbon source is supplied into the chamber,
wherein the plural outer electrodes are divided into plural groups,
wherein the common reserve tank is used for all the groups of the plural outer electrodes,
wherein each of the plural individual reserve tanks and each of the plural vacuum pumps are used only for each of the groups of the plural outer electrodes, respectively, and
wherein the chamber is evacuated by the common reserve tank, the plural individual reserve tanks and the plural vacuum pumps systems step by step when a corresponding valve is opened in turn.

28. A method for manufacturing a plastic container coated with a diamond-like carbon film, comprising the steps of:
inserting the plastic container into a chamber formed in each of plural outer electrodes;
inserting an inner electrode into the container received in the chamber of each of the plural outer electrodes;
evacuating the chamber and supplying gas as a carbon source into the chamber; and
generating plasma between the plural outer electrodes and the inner electrode when electric power is given to the plural outer electrodes by a high frequency power source so that the diamond-carbon film is formed on an inner surface of the plastic container,
wherein the high frequency power source is connected to each of the plural outer electrodes, and the plural outer electrodes are mutually connected by a wire.

29. A method for manufacturing a plastic container coated with a diamond-like carbon film according to claim 28,
wherein the plural outer electrodes are arranged in a circle, and
wherein the high frequency power source is connected to each of the plural outer electrodes by wires extended in a straight line from a center of the circle of the plural outer electrodes, and each of the plural outer electrodes is connected to an adjacent outer electrode by a wire.

30. A method for manufacturing a plastic container coated with a diamond-like carbon film, comprising the steps of:
inserting the plastic container into a chamber formed in an outer electrode;
inserting an inner electrode into the container received in the chamber;
evacuating the chamber and supplying gas as a carbon source into the chamber; and
generating plasma between the outer electrode and the inner electrode when electric power is given to the outer electrode by a high frequency power source so that the diamond-carbon film is formed on an inner surface of the plastic container,
wherein a reserve tank is connected to the chamber via a valve;

wherein plural vacuum pump systems are connected to the chamber via valves, respectively, and wherein the chamber is evacuated by the reserve tank and the plural vacuum pump systems step by step when a corresponding valve is opened in turn.

31. A method for manufacturing a plastic container coated with a diamond-like carbon film according to claim 30, wherein the reserve tank is connected to the chamber via a corresponding first valve, wherein one of the plural vacuum pump systems includes a rotary pump and is connected to the chamber via a corresponding second valve, wherein another one of the pump systems includes a cryopump and is connected to the chamber via a corresponding third valve, and wherein the chamber is evacuated by using the reserve tank when opening the first valve before the chamber is evacuated by using the pump system including the rotary pump when opening the second valve, and after that the chamber is evacuated by using the pump system including the cryopump when opening the third valve until pressure in the chamber is reduced to a predetermined value.

32. A method for manufacturing a plastic container coated with a diamond-like carbon film, comprising the steps of:

inserting an inner electrode into the container received in the chamber of each of the plural outer electrodes;

evacuating the chamber and supplying gas a carbon source into the chamber; and generating plasma between the plural outer electrodes and the inner electrode when electric power is given to the plural outer electrodes by a high frequency power source so that the diamond-like carbon film is formed on an inner surface of the plastic container, wherein plural individual reserve tanks are connected to the chamber via a valve, wherein a common reserve tank is connected to the chamber via a valve, wherein the diamond-like carbon film is formed on an inner surface of the plastic container by generating plasma between the plural outer electrodes and the inner electrode when electric power is given to the plural outer electrodes by the high frequency power source after the chamber is evacuated and gas as a carbon source is supplied into the chamber, wherein the plural outer electrodes are divided into plural groups, wherein each of the individual reserve tanks and each of plural vacuum pumps are used for each of the groups of the plural outer electrodes, respectively, wherein the common reserve tank is used for all the groups of the plural outer electrodes, and wherein the chamber is evacuated by the common reserve tank, the reserve tanks and the vacuum pump systems step by step when a corresponding valve is opened in turn.

* * * * *